US012696527B2

(12) United States Patent
Udrea et al.

(10) Patent No.: US 12,696,527 B2
(45) Date of Patent: Jul. 28, 2026

(54) POWER SEMICONDUCTOR DEVICE COMPRISING A SILICON SUBSTRATE

(71) Applicant: Cambridge GaN Devices Limited, Cambridge (GB)

(72) Inventors: Florin Udrea, Cambridgeshire (GB); Loizos Efthymiou, Cambridgeshire (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 474 days.

(21) Appl. No.: 18/324,559

(22) Filed: May 26, 2023

(65) Prior Publication Data

US 2024/0395805 A1    Nov. 28, 2024

(51) Int. Cl.
H10D 84/80       (2025.01)
H10D 8/60        (2025.01)
(Continued)

(52) U.S. Cl.
CPC ............. H10D 84/811 (2025.01); H10D 8/60 (2025.01); H10D 30/475 (2025.01); (Continued)

(58) Field of Classification Search
None
See application file for complete search history.

(56) References Cited

U.S. PATENT DOCUMENTS 8,390,091 B2    3/2013  Renaud
2008/0315257 A1  12/2008  Shiraishi
(Continued)

OTHER PUBLICATIONS

Lyu, et al., "GaN on Engineered Bulk Silicon Power Integration Platform With Avalanche Capability Enabled by Built-in Si PN Junctions", IEEE Electron Device Letters (2022) vol. 43, No. 11, pp. 1826-1829.

(Continued)

*Primary Examiner* — Bilkis Jahan
(74) *Attorney, Agent, or Firm* — Tarolli, Sundheim, Covell & Tummino LLP

(57) ABSTRACT

A III-nitride power semiconductor device comprising a heterojunction transistor, the heterojunction transistor comprising: an active III-nitride semiconductor region comprising at least one heterojunction formed between a GaN layer and a AlGaN layer; a drain terminal operatively connected to the active III-nitride semiconductor region; a source terminal laterally spaced from the drain terminal and operatively connected to the active III-nitride semiconductor region; and a gate terminal positioned over the active III-nitride semiconductor region, the gate terminal being formed between the drain terminal and the source terminal. The power device further comprises a substrate, wherein the substrate comprises a monocrystalline silicon material; a high voltage diode associated with the substrate, the high voltage diode comprising a cathode terminal, an anode terminal and a drift region, wherein at least a part of the drift region is formed within substrate; wherein the heterojunction transistor is positioned over the substrate such that the high voltage diode is located below at least part of the heterojunction transistor, wherein the drift region and is adjacent to and in physical contact with the active III-nitride semiconductor region.

19 Claims, 15 Drawing Sheets

(51) Int. Cl.
    *H10D 30/47*         (2025.01)
    *H10D 62/10*         (2025.01)
    *H10D 62/83*         (2025.01)
    *H10D 62/85*         (2025.01)
    *H10D 64/00*         (2025.01)

(52) U.S. Cl.
    CPC ........... *H10D 62/111* (2025.01); *H10D 62/83* (2025.01); *H10D 62/8503* (2025.01); *H10D 64/111* (2025.01)

(56) References Cited

U.S. PATENT DOCUMENTS

| | | | | |
|---|---|---|---|---|
| 2009/0008679 | A1 | 1/2009 | Saito | |
| 2011/0210337 | A1* | 9/2011 | Briere | H10D 88/00 |
| | | | | 257/E27.012 |
| 2011/0248283 | A1* | 10/2011 | Cao | H10D 64/251 |
| | | | | 257/E29.089 |
| 2012/0292665 | A1* | 11/2012 | Marino | H10D 30/4755 |
| | | | | 257/E21.409 |
| 2013/0009165 | A1* | 1/2013 | Park | H10D 30/4755 |
| | | | | 257/E21.403 |
| 2014/0015066 | A1* | 1/2014 | Wu | H10D 62/8503 |
| | | | | 257/E27.061 |
| 2014/0049296 | A1* | 2/2014 | Jeon | H03K 3/012 |
| | | | | 327/109 |
| 2016/0086878 | A1 | 3/2016 | Otremba et al. | |
| 2017/0301781 | A1* | 10/2017 | Boles | H10D 30/015 |
| 2017/0302151 | A1 | 10/2017 | Snook et al. | |
| 2021/0104623 | A1 | 4/2021 | Sriram | |
| 2021/0167199 | A1 | 6/2021 | Sriram | |
| 2021/0305417 | A1 | 9/2021 | Kim et al. | |
| 2022/0310832 | A1* | 9/2022 | Udrea | H10D 62/8503 |
| 2022/0344500 | A1 | 10/2022 | Sriram | |
| 2023/0378163 | A1* | 11/2023 | Chen | H10D 84/811 |

OTHER PUBLICATIONS

Kaminski, et al., "SiC and GaN devices—wide bandgap is not all the same" IET Circuits, Devices & Systems, (2014) vol. 8, issue 3, pp. 227-236 doi:10.1049/iet-cds.2013.0223.

Hult, "Design, Fabrication and Characterization of GaN HEMTs for Power Switching Applications" Thesis for the Degree of Licentiate of Engineering, (2022), Chalmers University of Technology, Department of Microtechnology and Nanoscience—MC2, Microwave Electronics Laboratory, 80 pages ISSN 1652-0769.

Lyu, et al., "GaN on Engineered Bulk Si (GaN-on-EBUS) Substrate for Monolithic Integration of High-/Low-Side Switches in Bridge Circuits", IEEE Transactions on Electron Devies (2022) vol. 69, No. 8, pp. 4162-4169.

Lyu, et al., "A GaN Power Integration Platform Based on Engineered Bulk Si Substrate with Eliminated Crosstalk between High-Side and Low-Side HEMTs", IEEE Electron Device Meeting (2021) vol. 5.2, pp. 1-5 doi: 10.1109/IEDM19574.2021.9720505.

Lyu, et al., "Substrate and Trench Design for GaN-on-EBUS Power IC Platform", IEEE Transactions on Electron Devies (2022) vol. 69, No. 7, pp. 3641-3647.

Luxembourg Search Report and Written Opinion issued in LU application No. 504334, dated Dec. 20, 2023, 16 pages.

Search Report for GB application No. GB2407080.7, dated Dec. 20, 2024, 17 pages.

* cited by examiner

POWER SEMICONDUCTOR DEVICE COMPRISING A SILICON SUBSTRATE

FIELD OF THE DISCLOSURE

The present disclosure relates to semiconductor devices. Particularly, but not exclusively, the disclosure relates to hetero-structure AlGaN/GaN high electron mobility transistors or rectifiers.

BACKGROUND OF THE DISCLOSURE

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems.

Additionally, GaN with its wide bandgap offers the potential for emitting light at higher frequencies for example the green, blue, violet, and ultraviolet portions of the electro-magnetic spectrum.

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm2/(Vs)) values. In addition, the piezopolarization charge present at the AlGaN/GaN heterostructure, results in a high electron density in the 2DEG layer (e.g. 1×1013 cm−2). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). Where specific Rds(ON) is often the product of the resistance of a device times the area of the device on wafer. An extensive amount of research has focused on the development of power devices using AlGaN/GaN heterostructures.

Layers which constitute the AlGaN/GaN heterojunction transistor are often epitaxially grown on a substrate from a different material for example Silicon (Si), Silicon Carbide (SiC) or Sapphire. Epitaxial growth of GaN on different substrates has advantages and disadvantages both in terms of the complexity and cost of growing high quality layers and in terms of device performance. A non-exhaustive list of things to consider when choosing a suitable substrate is: substrate lattice constant mismatch with GaN, substrate thermal expansion coefficient mismatch with GaN, substrate cost, substrate thermal conductivity etc.

Silicon is a popular option due to the low cost and availability of Silicon substrates. Use of Silicon as a substrate however comes with some disadvantages. Silicon and GaN have a large lattice constant mismatch and a large thermal coefficient mismatch. A transition layer is used to facilitate the growth of high quality GaN epitaxial layers on Silicon. A transition layer often comprises graded AlN/AlGaN layers or a 'superlattice'. A GaN buffer layer is grown on the transition layer. The GaN buffer layer is often carbon doped to limit vertical leakage from the surface high voltage terminal e.g. drain and the substrate back-end contact. An unintentionally doped GaN layer is then grown where the two dimensional electron gas at the interface with an AlGaN barrier layer is present.

In a GaN-on-Si lateral heterojunction transistor, the off-state potential exists both laterally and vertically. As used herein, laterally, refers to the dimension between the gate and drain terminal, where gate and drain contacts are both placed on the surface of the wafer. Vertically or longitudinally meanwhile, refers to the perpendicular dimension between the drain and substrate contact, for example as depicted in FIG. 1.

In existing designs, the Si substrate in a GaN-on-Si device is generally not electrically utilised i.e. it is not used to conduct any current in the normal operation of the device.

Additionally, the substrate does not sustain a significant voltage drop across it during the off-state operation of the device. The entire Si substrate may therefore act as a field plate, virtually taking the substrate potential which is often grounded. In that sense, the Si substrate may be described as offering a mechanical and thermal function but not necessarily an electrical function (or high voltage) in the operation of the device.

As such, the majority or even the entirety of the vertical potential drop is observed in the III-nitride epitaxial layers.

If vertical leakage or breakdown is the limiting factor, in order to increase the vertical breakdown of a device, the thickness of the GaN buffer layer is often increased which increases the cost and complexity of epitaxial growth.

An additional challenge in GaN HEMT is their lack of avalanche capability. Avalanche capability may be beneficial in a power device as it limits the maximum potential that can develop between the high voltage and low voltage terminals of a device, and therefore can limit the maximum electric field in the structure. This may provide reliability advantages, in terms of device lifetime as over-voltages in operation are limited. Because of the lack of avalanche capability, GaN HEMT can often be over engineered in terms of the actual breakdown being much higher than the rated breakdown. This is done by having larger dimensions (e.g. lateral distance between gate and drain and increased thickness of the GaN stack).

US2021/0104623 A1 describes a device including a source electrically coupled to a group III-nitride barrier layer; a gate electrically coupled to the group III-nitride barrier layer; a drain electrically coupled to the group III-nitride barrier layer; and a p-region being in the substrate or on the substrate below the group III-nitride barrier layer.

US2021/0167199 A1 describes an apparatus to address gate lag effect and/or other negative performance with a p-region that extends toward a source side of a substrate and towards a drain side of the substrate.

US2022/0344500 A1 describes a high-electron mobility transistor includes a substrate layer, a first buffer layer provided on the substrate layer, a barrier layer provided on the first buffer layer, a source provided on the barrier layer, a drain provided on the barrier layer, and a gate provided on the barrier layer.

U.S. Pat. No. 8,390,091 B2 describes a structure that includes a vertical Schottky diode, including an anode; a cathode including the substrate, and a Schottky barrier between the cathode and the anode, the Schottky barrier being situated between the substrate and an anode layer in a stack of layers.

SiC and GaN devices—wide bandgap is not all the same (Kaminski et al), IET Circuits Devices & Systems, 2014, Vol. 8, Iss. 3, pp. 227-236, contains discussions regarding the use of various materials in semiconductor devices.

GaN on Engineered Bulk Silicon Power Integration Platform with Avalanche Capability Enabled by Built-in Si PN Junctions (Chen et al), IEEE Electron Device Letters, Vol. 43, No. 11, November 2022 describes a GaN transistor on a silicon substrate. The device requires a transition layer separating the substrate from the GaN transistor. Design, Fabrication and Characterization of GaN HEMTs for Power Switching Applications (Björn Hult), Microwave Electronics Laboratory, Department of Microtechnology and Nanoscience, Chalmers University of Technology, 2022, contains discussions of AlGaN/GaN-on-SiC high voltage metal-insulator semiconductor (MIS) HEMTs fabricated on 'buffer-free' heterostructures.

SUMMARY

It is the object of this invention to provide a power device comprising a heterojunction transistor such as a high voltage HEMT on an active Si substrate which features an active diode, to thereby provide an efficient design facilitating an improved trade-off between on-state and breakdown of the power device. The high voltage diode within the substrate participates actively to support laterally and vertically a large fraction of the off-state high voltage between the drain and the source of the heterojunction transistor.

Power devices according to the present disclosure may further be configured to offer avalanche capability, as well as an efficient reverse conduction path leading to lower losses during reverse conduction.

The main terminals of the power device such as source, drain and gate can be the same as those of the heterojunction transistor and serve to connect the power device to other external devices/circuits or electrical rails such as drivers, controllers, high voltage or ground rails. Additional terminals can be present within the power device and these terminals can be operatively connected to the diode terminals.

Described herein is a power device comprising a first wide bandgap semiconductor placed above a substrate which comprises a high voltage diode made in a second low bandgap semiconductor, different from the first bandgap semiconductor. Part of the said diode is placed directly under part of the power device and is configured to support a substantial fraction of the voltage between the terminals of the power device.

In implementations, a wide bandgap semiconductor may be a semiconductor with a bandgap of at least 2 eV. Examples of such wide bandgap semiconductors include, non-exhaustively, GaN, AlGaN, AlN, GaO, SiC and Diamond. In contrast, a low bandgap semiconductor may be a semiconductor with a bandgap of less than 2 eV. The low bandgap semiconductor may be for example silicon. Silicon is a cheap, high quality material and is a commonly used material in the semiconductor industry In implementations, a high voltage may be a voltage between 30V and 10 kV.

In implementations, a "substantial fraction of the high voltage" may be a voltage between 20% to 100% of the total voltage between the main terminals of the power device (e.g. the drain and source).

The power device may preferably comprise a lateral heterojunction transistor such as a HEMT, and the first wide bandgap semiconductor may be based on III-Nitride. The first wide bandgap semiconductor may comprise a heterojunction between a GaN layer and a AlGaN layer.

Alternatively, the first wide bandgap semiconductor may comprise GaO, AlN or AlGaN, and the power device may be a MOFSET, MESFET, deep depletion FET, or other suitable transistor.

According to an aspect of the invention, there is provided a III-nitride power semiconductor device comprising:

a heterojunction transistor, the heterojunction transistor comprising:

an active III-nitride semiconductor region comprising a heterojunction formed between a GaN layer and a AlGaN layer;

a drain terminal operatively connected to the active III-nitride semiconductor region;

a source terminal laterally spaced from the drain terminal and operatively connected to the active III-nitride semiconductor region; and a gate terminal positioned over the active III-nitride semiconductor region, the gate terminal being formed between the drain terminal and the source terminal; and a substrate, wherein the substrate comprises a monocrystalline Si material and a high voltage diode, the high voltage diode comprising a cathode terminal and an anode terminal;

wherein the heterojunction transistor is positioned over the substrate such that the high voltage diode is located below at least part of the heterojunction transistor.

While the following description is restricted to a device comprising a HEMT, GaN/AlGaN heterojunction and Si substrate, it will be understood that more broadly embodiments of the invention may comprise other wide bandgap materials and transistors as described above.

The high voltage diode comprises a drift region responsible or configured for blocking most or at least part of the voltage when the diode is in a reverse bias mode (i.e. the cathode is positively biased with respect to anode).

At least part of the drift region sits directly under the active III-nitride semiconductor region and therefore participates directly to support both laterally and vertically a high voltage or a fraction of the high voltage between the drain terminal of the heterojunction transistor and the anode terminal of the diode, when the heterojunction transistor is in the blocking mode or during the transient states In embodiments, an AlGaN/GaN heterojunction device on a Si substrate is proposed, with a diode incorporated in the Si substrate. The heterojunction transistor can be a HEMT. The HEMT can achieve a more effective potential distribution during the blocking mode (OFF-state bias) or during transients (from low voltages to high voltages or opposite) through a more effective use of the Si substrate, compared to AlGaN/GaN HEMTs in prior art. More effective use means that the Si substrate may be electrically utilised as a high-voltage region, by seeing a part of the potential drop between the high voltage terminal and the low voltage terminal in the device off-state. This is achieved through a diode based on a high-voltage junction in the Si substrate layer. The junction may be part of a p-n diode. Alternatively, a diode based on a p-i-n or p+/p–/n+ or p+/n–/n+ junction, a diode based on a Superjunction or a Schottky diode may be used. Bipolar diodes such as p-n or P-I-N or p+/p–/n+ or n+/p–/p+ junction have generally lower leakage currents and require ohmic metallization. Schottky diodes have relatively higher leakage currents and require at least one non-ohmic, Schottky contact with either the anode or cathode terminal. Combinations of bipolar/Schottky diodes such as Junction Barrier diodes or Merged Schottky-bipolar diodes (also known as Merged p-n Schottky diodes or MPS diodes) can also be used.

The incorporation of a Si diode under at least part of the HEMT device facilitates a design with an improved specific ON-state resistance, as the dimension of the GaN HEMT do not need to be over engineered.

Moreover, the effective use of the Si substrate as a region can allow a thinner GaN-based layers for the same voltage rating or increased voltage ratings to be achieved without increase in the thickness and complexity of the transition layer and GaN buffer layer. This is advantageous both from a cost perspective and reduced process complexity perspective. Furthermore, since the voltage is laterally distributed within the heterojunction transistor with little or virtually no vertical component, there is less risk of traps being ionized in the GaN buffer which could create reliability issues such as Dynamic Ron increase.

With increasing OFF-state bias voltage, impact ionization in the depletion region of the reverse biased diode in the Si substrate will lead to avalanche breakdown. The reverse biased diode in the Si substrate may be designed to reach avalanche breakdown before other modes of breakdown in the HEMT (such as soft breakdown due to leakage currents, or static or time-dependent dielectric breakdown) occur in the nitride epitaxial layers or the passivation/dielectric layers in the device, or vertically between the surface terminals and the substrate terminal. Having avalanche capability is highly desirable in some power electronics application, for example because if the surge energy of the device is not exceeded, then avalanche breakdown is recoverable. On the other hand, other modes of breakdown which may occur in conventional GaN HEMT device, such as dielectric breakdown, are not recoverable.

If a p+/p-/n+ or p+/n-/n+ diodes are used the cathode terminal of the diode can be connected to the drain terminal of the HEMT via a potential divider while the anode terminal of the diode can be connected to the source terminal of the HEMT. The potential divider role is to ensure that the Silicon diode takes only fraction of the voltage taken by HEMT. This is because the critical avalanche electric field of the Silicon diode is significantly smaller than the critical avalanche field of GaN (a factor of approximately 10×). Thus, as an example if the drain of the HEMT is biased at 800V, the silicon diode placed underneath can be biased at 200V.

The potential divider can be made of large resistors or resistors and capacitors. These can be integrated or provided externally. The large resistors may advantage help to avoid or reduce large drain to substrate leakage when the drain is biased at high voltages.

Alternatively, the silicon diode can be biased with a fixed DC potential on the cathode so that it creates a depletion region which indifferent of the switching of the GaN HEMT. The cathode potential may be designed such that the depletion region in the diode does not affect the 2DEG while the HEMT is in the on-state. On the other hand, the presence of the depletion region right under the HEMT helps with reducing the parasitic capacitances ensuring very fast switching. This may be advantageous in systems with very high frequency. For example, the Silicon diode can be biased continuously at 100V, while the HEMT may switch from an on-state of 1V to an off-state of 800V.

If a p+/p-/n+ diode is used the anode terminal may be connected to the backside of the Si substrate (i.e. as the substrate terminal). If a p+/n-/n+ diode is used the cathode terminal for the p+/n-/n+ diode may be connected on the backside of the substrate (i.e. as the substrate terminal).

Furthermore, the parasitic input and output capacitances in the GaN HEMT limit the losses and speed during the transient signals (in particular the turn-on). By providing a depletion region in the Si diode under the GaN HEMT, the capacitances (in particular the output capacitance) can be reduced or minimised. The large body of the depletion region in Si, present at higher voltages in the drift region, when the Si diode is reverse biased directly under the III-nitride semiconductor region leads to a small capacitance, minimising the switching losses and switching time.

Thus, according to an aspect of the invention, there is provided a power semiconductor device comprising a heterojunction transistor featuring at least three terminals, source, drain and gate and having at least one GaN layer and at least one AlGaN layer and at least one heterojunction formed between the at least one GaN layer and the at least one AlGaN layer, wherein the GaN HEMT is located above a monocrystalline Silicon substrate, wherein the monocrystalline Silicon substrate comprises a high voltage diode which features two terminals, anode and cathode, wherein the Si diode comprises a drift region, and at least part of the drift region is directly located under at least part of the heterojunction transistor.

Part of the drift region is physically arranged directly under the active III-nitride semiconductor region, thus during the blocking mode the voltage is shared laterally in the active III-Nitride semiconductor region as well as the Si drift region. The Si drift region is also responsible for taking a substantial fraction of the vertical voltage between the drain and source terminals of the power device (for e.g. when the source terminal is connected to the anode terminal of the high voltage diode). In a further embodiment, virtually all the vertical voltage is supported within the drift region of the Si diode.

In one example, the heterojunction transistor may comprise one or multiple heterojunctions with one or multiple 'active' 2DEG channels. "Active" meaning that in the on-state of the HEMT, the current flows through at least one or multiple 2DEG channels.

The silicon diode may contain a drift region (or a high voltage region that blocks the voltage, when the diode is reverse biased), and wherein at least part of the drift region is directly located under part of the active area of the HEMT region (by "active region" it is meant the area where on-state conduction takes place) and in physical contact with the III-Nitride semiconductor region.

When the HEMT is in the blocking mode (a high voltage is applied to its drain with respect to its source), the diode is in reverse bias (cathode is positively biased against the anode), blocking a substantial fraction of the blocking voltage within its drift region. In one example, the anode terminal of the diode and the source terminal of the HEMT may be electrically connected together.

In another example, the anode terminal of the said diode may be connected to a low voltage DC terminal.

The anode terminal of the said diode may be connected to the bottom or backside of the Silicon substrate.

In another example, the anode terminal of the diode may be connected to the top, upper or front side of the Silicon substrate.

Due to the significantly higher critical electric field of GaN compared to Silicon, the diode in the Silicon substrate may only be able to sustain a lower potential than the GaN HEMT.

Therefore, in on example, the cathode terminal of the diode and the drain terminal of the HEMT are electrically connected through a potential divider such that the potential on the cathode terminal is smaller than the potential on the drain of the HEMT. For example, the potential on the cathode terminal may be 2, 3, 4, 5 or more times smaller than the potential on the drain terminal of the HEMT. The potential divider may consist of or comprise large resistors or resistors and capacitors, which are provided either externally, or within the same package or monolithically integrated with the GaN HEMT.

In another example, the said cathode terminal may be connected to a fixed high voltage rail.

The drift region of the said diode in Silicon may comprise a p-type or n-type doped regions. When the GaN HEMT is supporting a high voltage across its drain to source terminals, the said diode may be reverse biased and therefore support a large depletion layer within the p-type or n-type region. At least part of the depletion layer may be formed directly under the active area of the HEMT and in physical contact with the III-nitride semiconductor region and therefore contributes to the support of the voltage vertically between the drain terminal of the HEMT and the anode terminal of the diode.

The said p-type or n-type doping region dimensions (depth) and doping levels may be designed to support a large (desirable) voltage between the anode and cathode terminals of the diode.

In other examples, the cathode terminal of the high voltage diode may be connected to the backside of the Si substrate. The cathode terminal may comprise a back metallization contact. This is particularly the case if a highly doped n+ substrate (second conductivity type) is used, or a layer of n+ is implanted on the backside of the substrate.

In one example, at least one additional n-type or p-type doped region may be formed at the surface of the Silicon substrate and directly above at least part of the said p-type or n-type doped regions. The at least one additional n-type or p-type region may be more highly doped than the n-type or p-type drift region. In examples, the cathode or the anode terminal may connect electrically to the at least one of the additional n-type or p-type regions respectively. The additional n-type and p-type regions may be described as n+ layer or p+ layer respectively.

In one example, at least one additional p-type or n-type doped region may be formed directly below at least part of the p-type or n-type drift regions. The at least one additional p-type or n-type region may be more highly doped than the n-type or p-type drift region. In some examples, the anode terminal or the cathode terminal may connect electrically to the at least one p-type region or n-type region, respectively. The additional p-type or n-type region may be described as a p+ or n+ layer, respectively.

In another example, the Silicon substrate contains a superjunction structure formed of alternating n/p stripes (e.g. as a stack of layers comprising at least one p and at least one n stripe) arranged vertically on top of each other from the top of surface of the Silicon substrate down towards the backside of the substrate and directly below at least part of the GaN HEMT. A diode may be formed in Silicon featuring an anode and cathode terminals and the said Si superjunction. The superjunction may be designed for charge compensation and wherein the charge contribution for the at least one 2DEG layer is considered, as well as any other existing charges within the GaN HEMT.

In one example, the cathode terminal forms at least in part a Schottky contact to the Silicon substrate, such that a Schottky diode is built between the anode and cathode terminals.

In another example, the anode terminal forms at least in part a Schottky contact to the Silicon substrate, such that a Schottky diode is built between the anode and cathode terminals.

The Schottky terminal may be based on an energy (voltage) barrier formed between a metal (with a specific work function) and a semiconductor substrate.

In the previous two examples, the diode formed in the Si substrate is a Schottky based diode, for example a Junction barrier diode, or a merged bipolar-Schottky diode, wherein Schottky contacts are placed between adjacent p+ or n+ rings or regions (to minimize leakage currents within the diode itself).

In any of the examples above, the HEMT breakdown may be limited by the avalanche of the Silicon diode. Therefore, the said Silicon diode may be said to provide avalanche capability to the said power device.

In some examples, a power device or multiple (i.e. two or more) power devices may comprise multiple heterojunction transistors on a common Silicon substrate comprising at least one high voltage diode. The multiple heterojunction transistors may be two HEMTs connected in a half bridge featuring a common Silicon diode underneath, or featuring two different Silicon diodes with different cathode terminals and anode terminals.

In another example, additional low-voltage devices or circuits, are integrated either in in the GaN layers or the Si substrate adjacent to the HEMT device or adjacent to the diode built in Si. The low-voltage devices or circuits may comprise, non-exhaustively, any one or more of Miller clamps, sensing and protection circuits or driver circuits.

In all the examples above the diode embedded in the Si substrate may have a combined lateral-vertical configuration, meaning that the drift region placed directly under and in direct contact with the active III-nitride semiconductor can support the voltage both laterally and vertically. The potential lines could curve (bend) from a lateral dimension within the active III-nitride semiconductor region towards the surface of the substrate (the interface between the active III-Nitride region and the Si substrate) to gradually become vertical within the bulk of the Si substrate between a surface terminal and a back-side terminal. That is to say that potential lines are continuous but gradually changing direction from the HEMT blocking region to the drift region within the Si diode in the substrate,

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

DETAILED DESCRIPTION OF THE PREFERRED EMBODIMENTS

Figure 1:
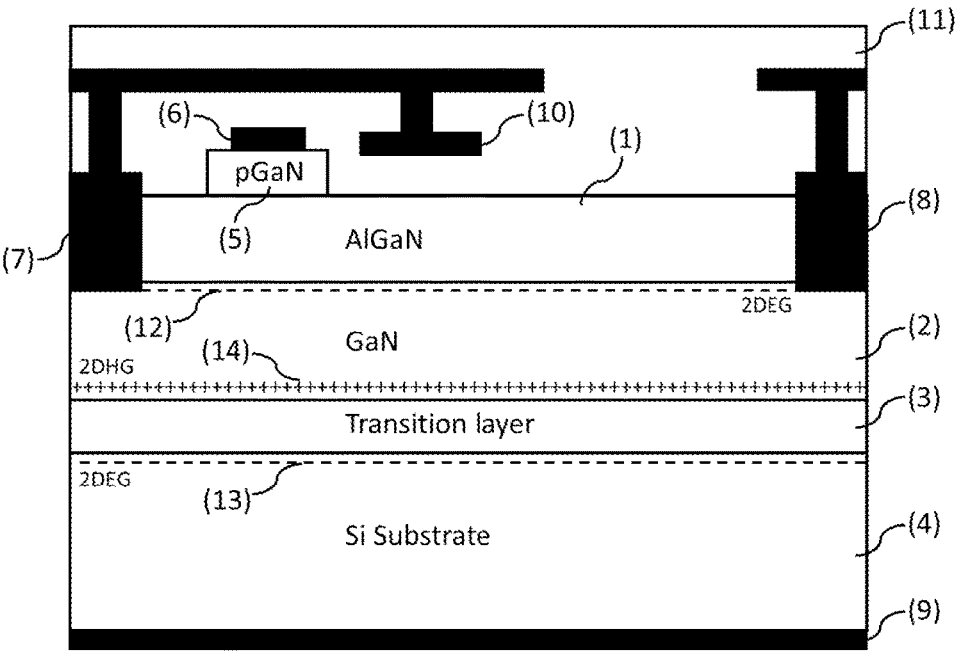
FIG. 1 depicts schematically a cross section of an AlGaN/GaN HEMT.

Like reference numerals are provided for corresponding features depicted in multiple figures.

This is illustrated in FIG. 1 which shows a GaN-on-Si HEMT. The backside of the wafer is often connected to the source potential, often at package level.

FIG. 1 illustrates an example cross section of an AlGaN/GaN HEMT cross section. Various substrate materials can be used in place of Si, such as Silicon Carbide and sapphire.

The HEMT comprises an AlGaN/GaN heterojunction where a two-dimensional electron gas (2DEG) (12) is formed. The AlGaN/GaN heterojunction layers are grown epitaxially on the substrate (4). A transition layer (3) is present between the AlGaN/GaN heterojunction layers and the substrate. The device may comprise a substrate back metallisation contact (9). Due to the spontaneous and piezolelectric polarisation of GaN (and AlGaN, AlN) fixed charges are present at the interfaces between the different layers.

The fixed charges attract mobile carriers which may form two dimensional gases of carriers of the opposite polarity of the fixed charge. In addition to the 2DEG (12) at the AlGaN/GaN interface, a 2DEG (13) may also be present at the transition layer/substrate interface. A two-dimensional hole gas (14) (2DHG) may be present at the GaN/transition layer interface. The relative strength (i.e. carrier concentration) of the two-dimensional gases may be affected by several parameters (mechanical stress as it determines the magnitude of piezopolarisation charges, interface traps, doping) and may vary significantly in devices. In some cases, the carrier concentration in the two-dimensional gases at the interface of the transition layer may be negligible.

The device in FIG. 1, further comprises a highly p-doped GaN region (5) which depletes the 2DEG under it at zero bias conditions to create an enhancement mode transistor. A gate contact (6) is placed on the p-GaN region (5). In other examples, different gate technologies may be used.

The 2DEG (12) is contacted by a source contact (7) and a drain contact (8). In the example given in FIG. 1, the contacts to the 2DEG (12) are made by recessing the AlGaN layer (1). Other methods of forming ohmic contacts may be used.

The substrate may be connected to the source contact potential. This may be done at package level, printed circuit board (PCB) level, or device level. This is not illustrated in this example.

It is common in power HEMTs (and in power devices in general) to design field plate structures to shape the potential distribution during OFF-state bias conditions. A metal field plate structure (10) is illustrated as an example in FIG. 1. The device further comprises surface passivation of the semiconductor layers and additional intermetal dielectric layers. For clarity in the illustration, these layers are depicted as a single region 11.

Figure 2:
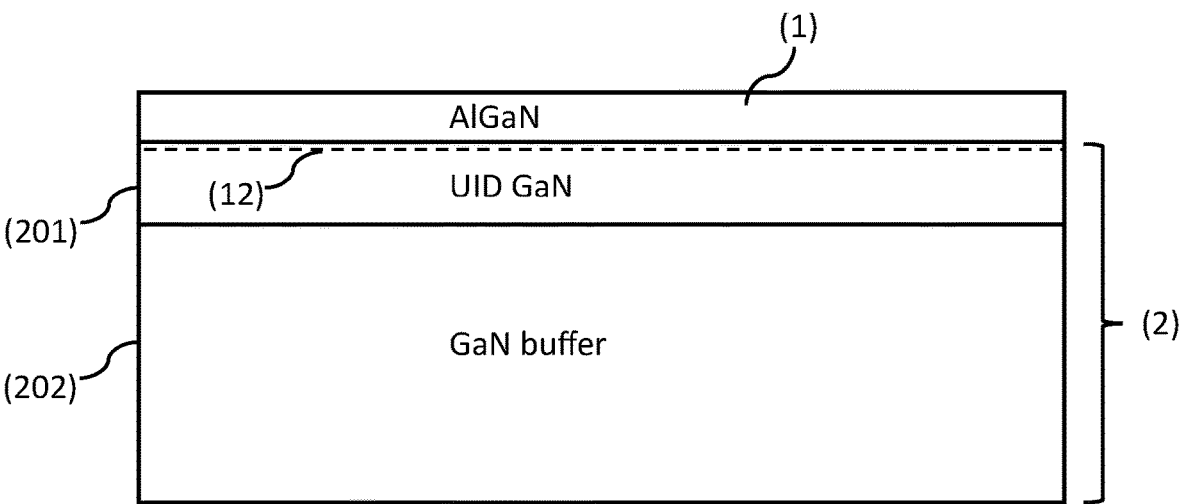
FIG. 2 depicts schematically a cross section of the GaN region.

FIG. 2 illustrates an example of a cross section of the GaN region (2) showing its sub-division into two further regions; a GaN buffer (202) and an unintentionally doped (UID) GaN region (201). The GaN buffer may be thicker (2-4 um for a 650V rated device) and substantially doped. The UID GaN region may have a thickness of 0.1-0.4 um. In embodiments of the invention illustrated in the figures below, the GaN buffer layer may be substantially thinner or not present at all.

Figure 3:
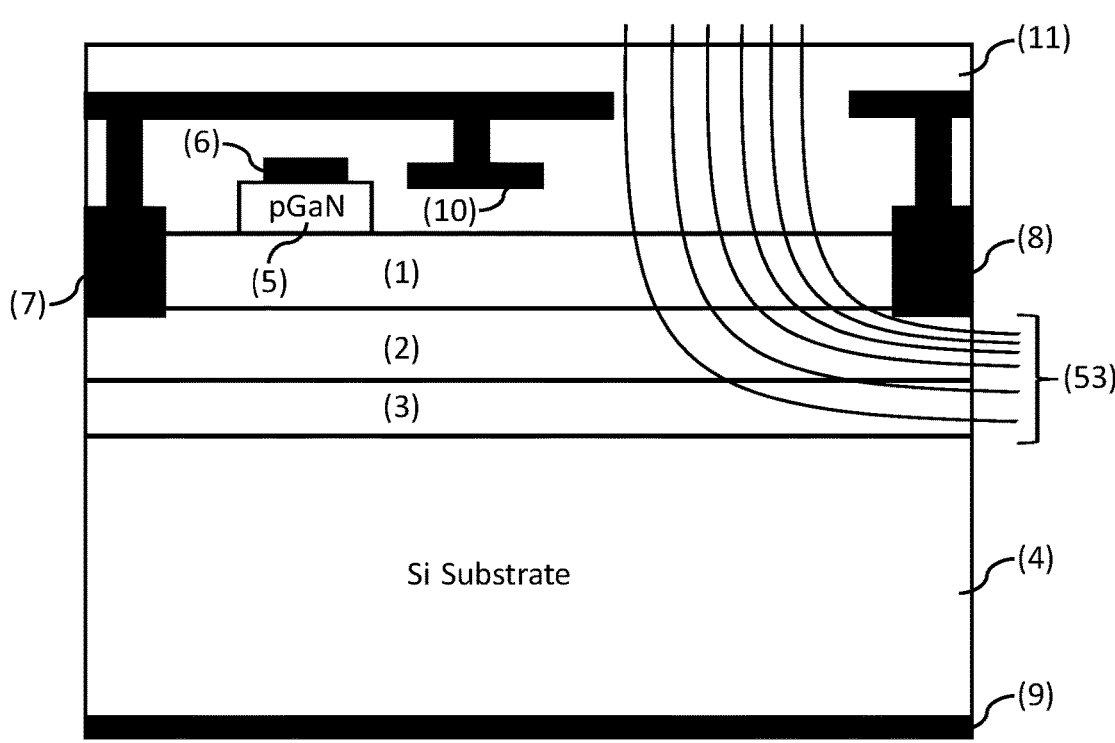
FIG. 3 depicts schematically an example potential distribution under off-state bias.

FIG. 3 illustrates an example of the potential distribution in a GaN HEMT such as that depicted in FIG. 1 under off-state bias. FIG. 3 depicts equipotential lines (53) in the structure, the equipotential lines (53) representing the potential distribution of the device. It will be understood that FIG. 3 is a schematic representation, and that therefore the equipotential lines represent an approximation of the potential distribution. If the substrate is both doped and connected to source potential, then the front end or surface of the substrate will be at near source potential under off-state bias. This will lead to the majority of the vertical potential drop to be present in the III-nitride epitaxial layers, and will therefore generally require a thicker GaN buffer layer to sustain the potential.

Figure 4:
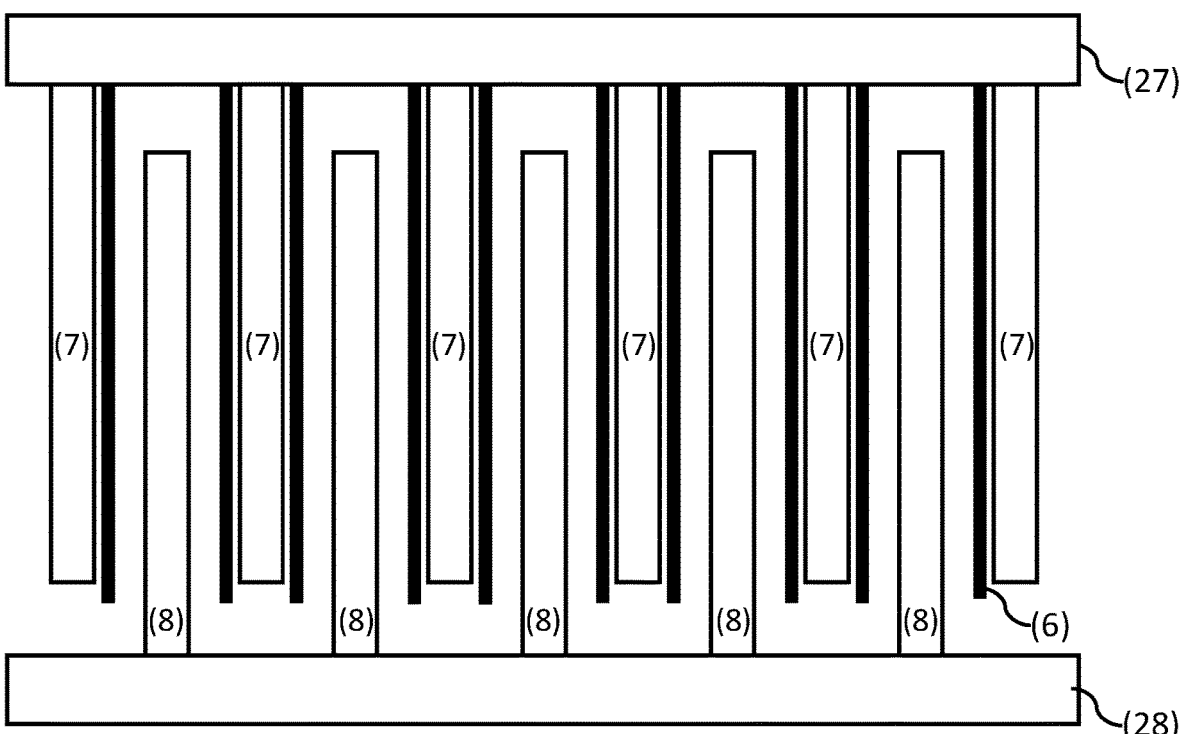
FIG. 4 depicts schematically a top view of the AlGaN/GaN HEMT of FIG. 1.

FIG. 4 illustrates a top view of an example layout of the device illustrated in FIG. 1. The layout of GaN HEMTs is often in an interdigitated configuration, that is it comprises of alternating fingers of source, gate and drain contacts. Individual fingers may be connected with track metallisation such as source track metallisation (27) and drain track metallisation (28).

Figure 5:
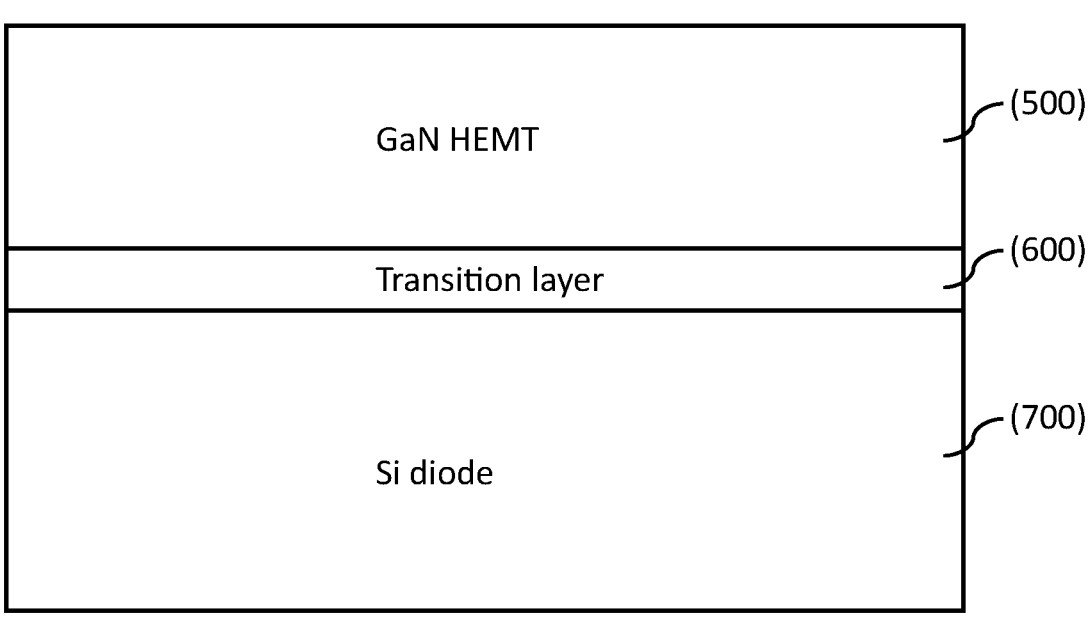
FIG. 5 depicts schematically a GaN region according to embodiments of the present disclosure.

FIG. 5 illustrates an embodiment according to the present disclosure which comprises a GaN HEMT region (500) and a Si diode region (700). A nucleation layer, which is required to grow epitaxial III-nitride layers on a Si substrate, is also illustrated (600). At least one section of the Si diode region is directly below the GaN HEMT region, as illustrated.

Figure 6:
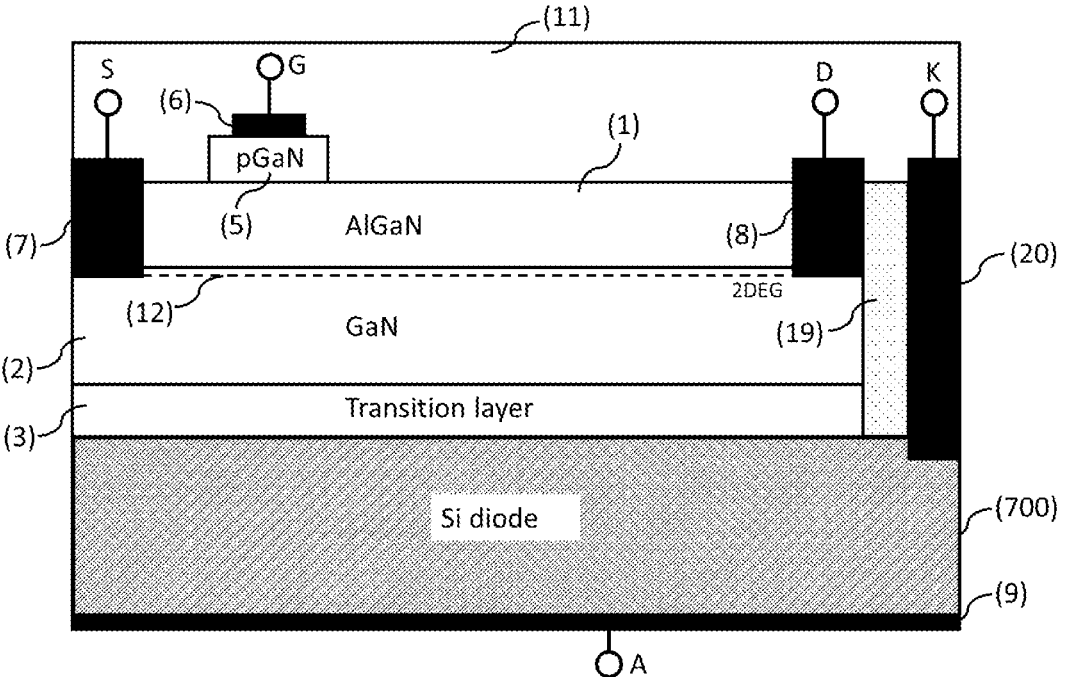
FIG. 6 depicts schematically a GaN HEMT according to embodiments of the present disclosure.

FIG. 6 illustrates a schematic of an additional embodiment according to the present disclosure. In this schematic, the GaN HEMT is illustrated in more detail than in FIG. 6, and comprises the AlGaN (1)/GaN (2) heterojunction, the 2DEG (12), a pGaN region (5), a gate contact (6), a source contact (7) and a drain contact (8). The GaN HEMT has three terminals source (S), gate (G) and drain (D). The Si diode is illustrated as having two terminals, a cathode (K) and an anode (A). The anode may be a back metallisation layer (9). The cathode may be a contact (20) on the frontend of the wafer. An isolation layer (19) may be present between the cathode and the GaN HEMT.

Figure 7:
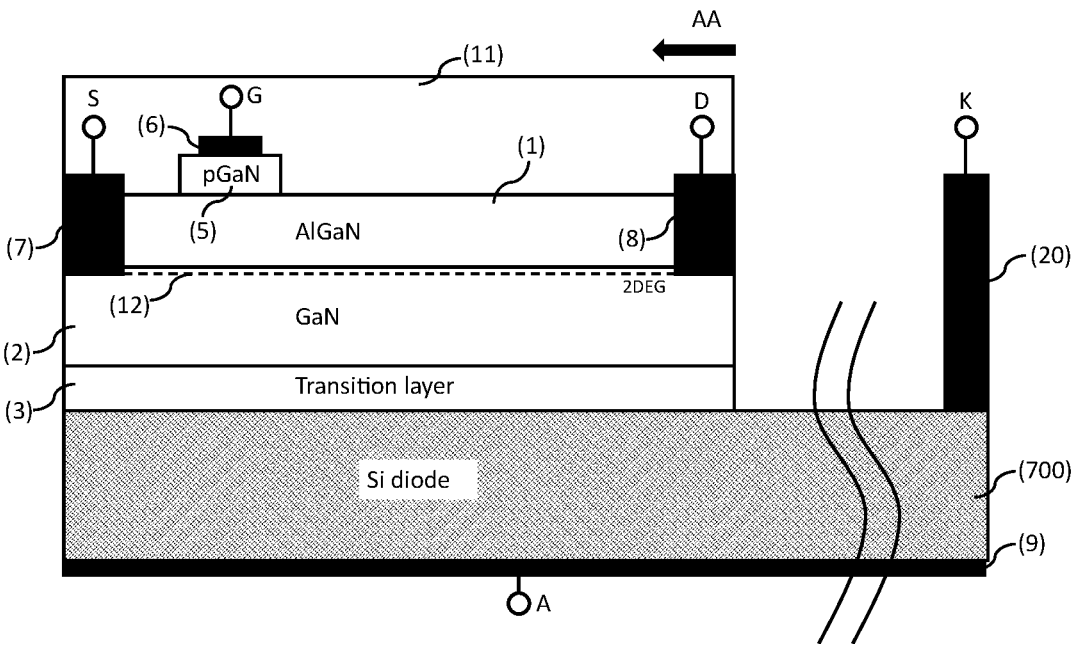
FIG. 7 depicts schematically a GaN HEMT according to further embodiments of the present disclosure.

FIG. 7 illustrates a schematic of a further embodiment similar to FIG. 6. This embodiment illustrates that one of the contacts of the Si diode may be placed a distance from the active area (AA) of the GaN HEMT, e.g. separated by a large enough distance that it is not a part of alternating pattern of fingers of a GaN HEMT in an interdigitated device layout. A section of the Si diode (700) may still be directly below the GaN HEMT.

Figure 8:
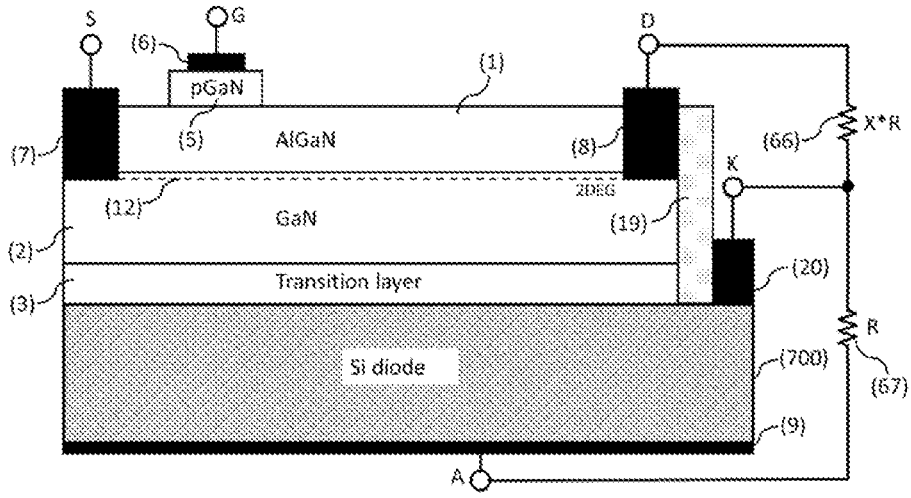
FIG. 8 depicts schematically a GaN HEMT according to further embodiments of the present disclosure.
Figure 9:
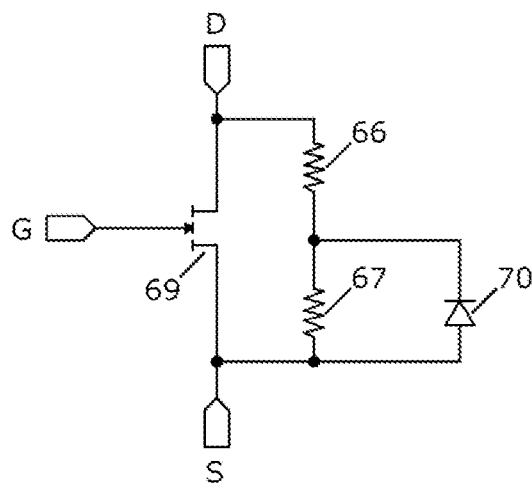
FIG. 9 depicts a circuit schematic of the GaN HEMT depicted in FIG. 8.

FIG. 8 illustrates a schematic of an additional embodiment similar to FIG. 6, but which comprises a potential divider (66, 67). The potential divider can set the potential at the cathode (K) of the Si diode, as a fraction of the potential of the drain terminal (D) of the GaN HEMT. An equivalent circuit schematic is illustrated in FIG. 9.

Silicon has a substantially lower critical electric field than GaN. Therefore, it may be desirable to set a lower potential at the cathode terminal in order to prevent a breakdown (via avalanche of the Si diode) below the desirable voltage rating. By suitably selecting the ratio of the resistors in the potential divider, the potential at which the device enters avalanche may be set. In one example, a resistor between the drain and cathode may have a resistance five times larger than a resistor between the cathode and anode, for example 5GΩ vs 1GΩ. More generally, the ratio between the resistors may be selected at a level to provide a desirable potential for entering avalanche breakdown. It is generally preferable to use large resistors (e.g. with resistances on the order of a MΩ or more) in the potential divider to avoid or reduce a large drain-to-source current when the GaN HEMT is in the off-state mode of operation. The potential divider may be monolithically integrated, for example it may be a 2DEG resistor. However, due to the size of larger resistors, it may be easier not to include the potential divider on wafer. For example, the resistors may be co-packaged with the GaN HEMT/Si diode chip, or may be placed at the PCB level. The potential divider may be used in any of the examples illustrated herein.

Figure 10:
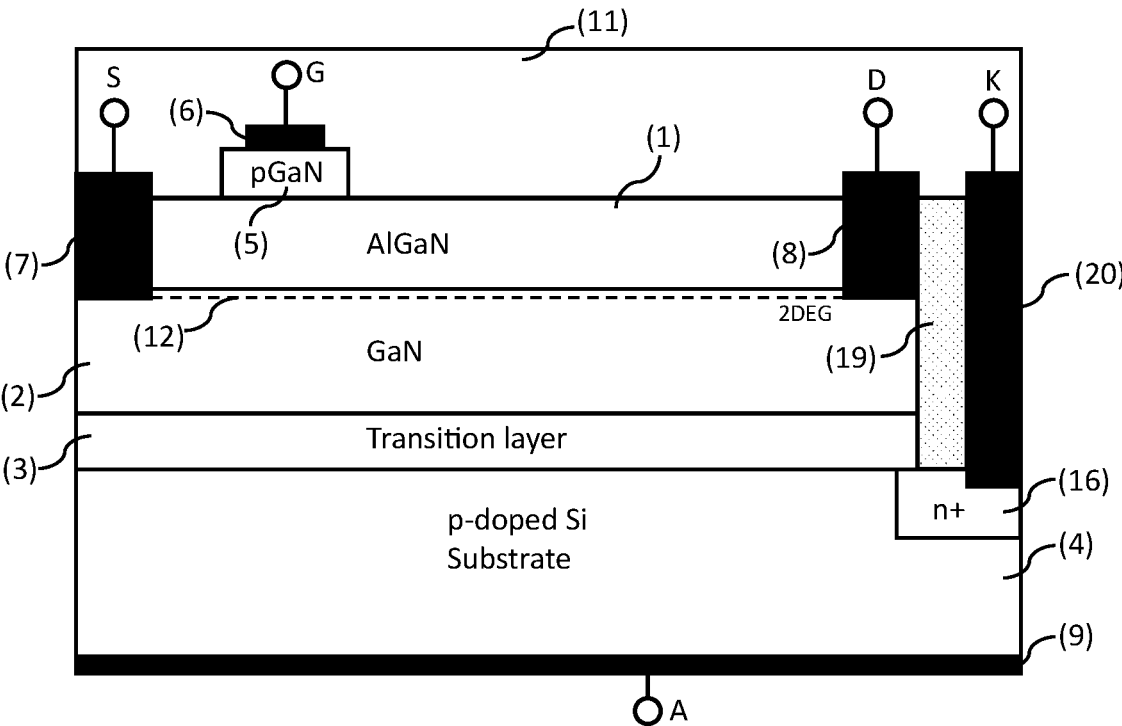
FIG. 10 depicts schematically a GaN HEMT according to further embodiments of the present disclosure.

FIG. 10 illustrates a further embodiment according to the present disclosure. This embodiment comprises a GaN HEMT as presented in previous figures. The field plate structure is not illustrated for simplicity. The GaN HEMT is a three-terminal device with a source (S), gate (G) and drain (D) terminal. The structure illustrated in FIG. 9 comprises an additional diode associated with the Si substrate. The Si diode is a two-terminal device with a cathode (K) and an anode (A). In this embodiment, the Si diode is a p-n diode formed between a highly doped n+ cathode region (16) and a p-doped Si substrate (4). The cathode (K) is formed using a metal cathode contact (20) and the anode (A) is formed as substrate back metallisation anode contact (9).

Several examples of suitable Si diodes are described below. In some examples, the drain terminal and the cathode terminal may be connected through a potential divider as illustrated in FIG. 8 and FIG. 9.

The source terminal and the anode terminal may be connected at device level, package level, or at PCB level, or may be a common terminal.

Figure 11:
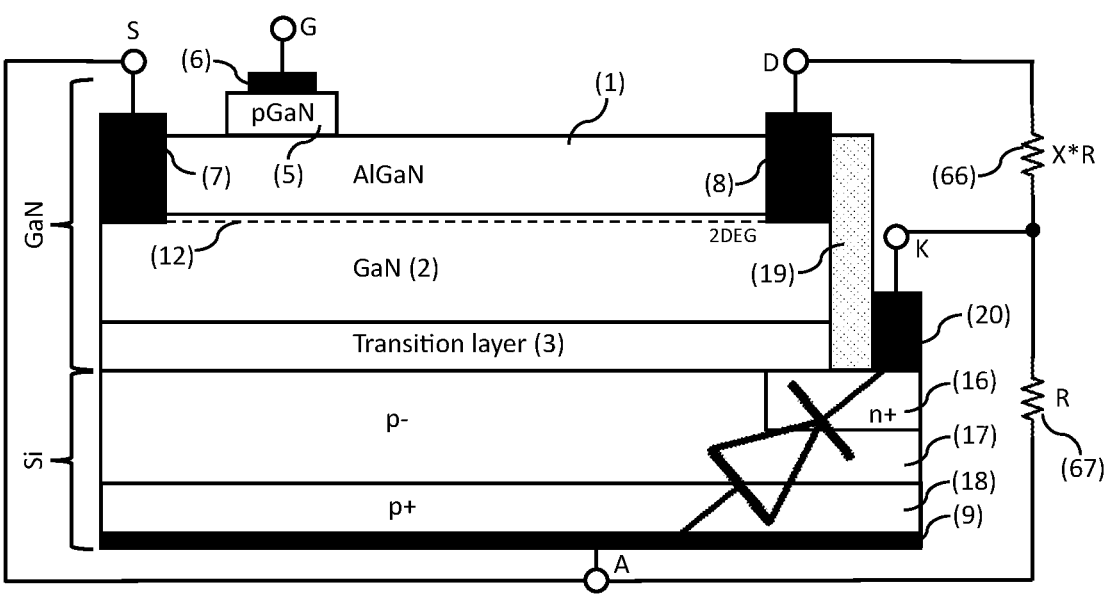
FIG. 11 depicts schematically a GaN HEMT according to further embodiments of the present disclosure.

FIG. 11 illustrates an additional embodiment. This embodiment is similar to the embodiment illustrated in FIG. 10 with differences in the doping of the Si substrate. This embodiment may be more suitable for the formation of a high voltage diode compared to the embodiment illustrated in FIG. 10. Rather than forming a p-n junction in the Si substrate, a p+/p−/n+ junction is formed. That may refer to a region of the Si substrate being at a lower doping, therefore forming a p-drift region (17) and a p+ anode region (18) in the substrate. The high voltage Si diode drift region is in physical contact with the Ill-nitride layer above. This embodiment may offer a more favourable potential distribution during reverse bias in the Si diode than the embodiment in FIG. 10.

Figure 12:
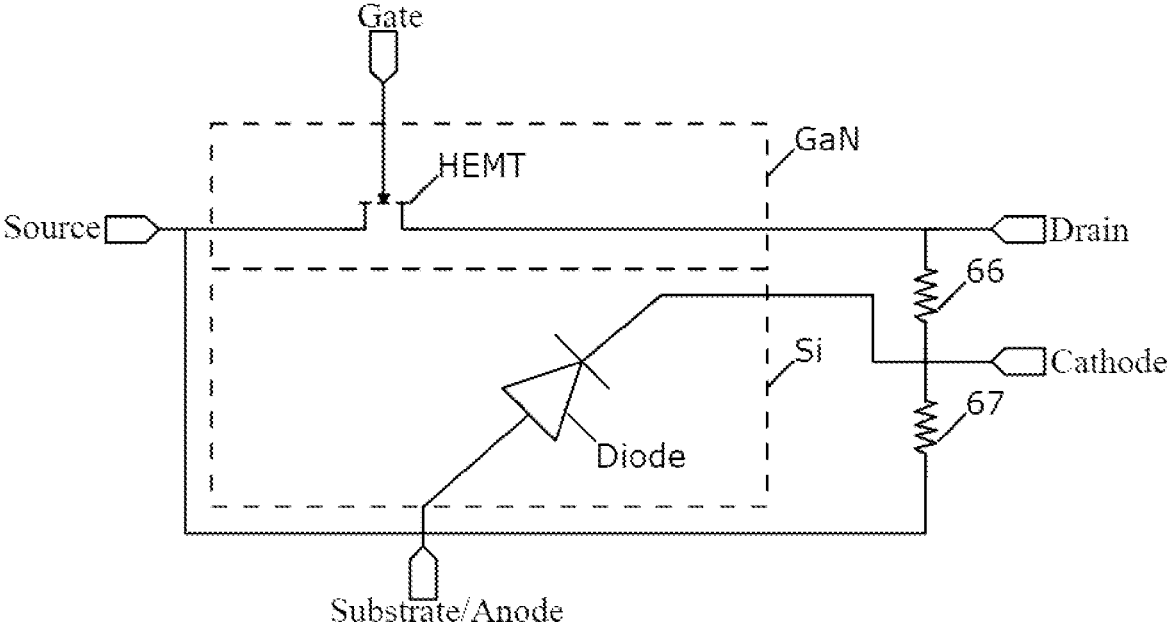
FIG. 12 depicts a circuit schematic of the GaN HEMT depicted in FIG. 11.

FIG. 12 illustrates a circuit schematic corresponding to e.g. the device depicted in FIG. 11. The schematic comprises a GaN HEMT, a potential divider and a Si diode. The GaN HEMT drain terminal (D) and the Si diode cathode terminal (K) are connected in this example through a potential divider, such that only a fraction of the drain potential is applied to the cathode terminal. The GaN HEMT source terminal (S) and the Si diode anode terminal (A) are also connected in this example.

In the following figures, only the regions in the Si will be shown in detail for simplification in order to illustrate different implementations of a diode, with the GaN HEMT illustrated as a single block. However, it will be understood that each of the example GaN HEMTs described above may be combined with each of the substrate discussed below, in place of the GaN HEMT block.

The cathode contact of the diode in the following examples may be implemented in any of the ways illustrated thus far, and are not limited to the specific contact implementation depicted in the embodiment. Example contacts (20) with and without an isolation layer (19) are shown in FIG. 13 and FIG. 14.

Figure 13:
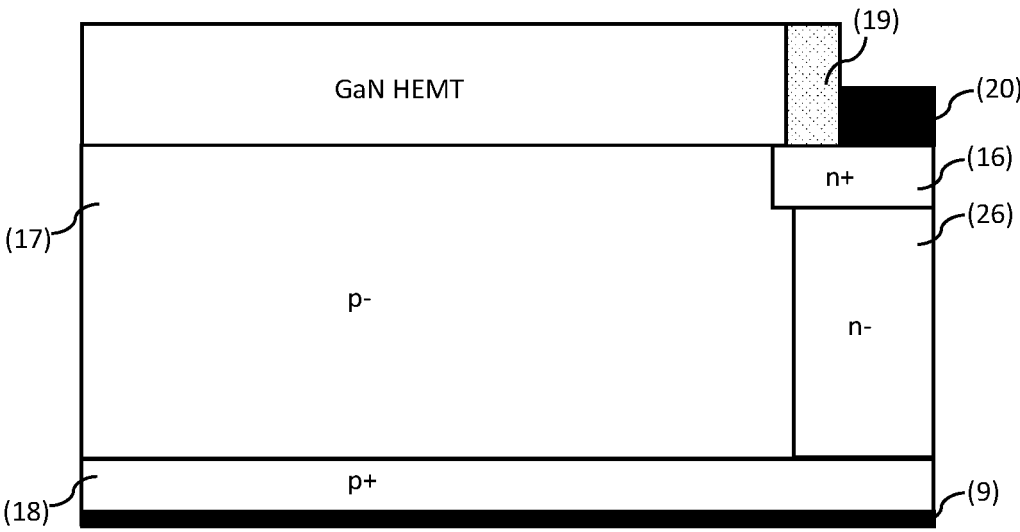
FIG. 13 depicts schematically a junction formed in a substrate according to embodiments of the present disclosure.

In FIG. 13, the junction formed in the Si substrate is a Superjunction. This is achieved by incorporating an n-doped pillar (26) in the drift region of the p+/p−/n+ junction illustrated in previous examples.

Figure 14:
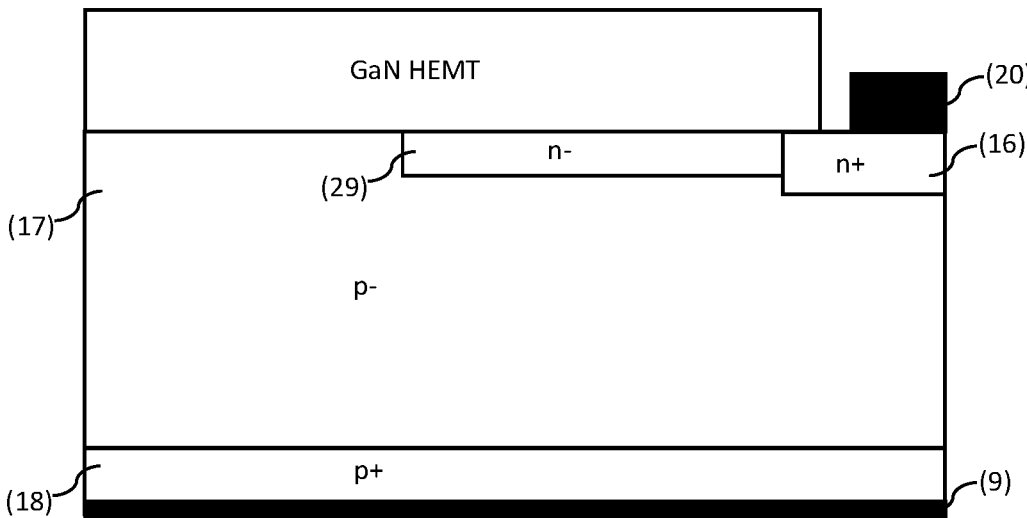
FIG. 14 depicts schematically a junction formed in a substrate according to further embodiments of the present disclosure.

FIG. 14 illustrates an additional embodiment similar to the embodiment in FIG. 11. In this embodiment, the Si diode comprises an additional n-region (29). This region may be included to achieve an improved potential distribution in the structure when the diode is in reverse bias. The n-region may reduce the electric field peak at the edge of the n+ cathode region (16) at a given voltage bias.

Figure 15:
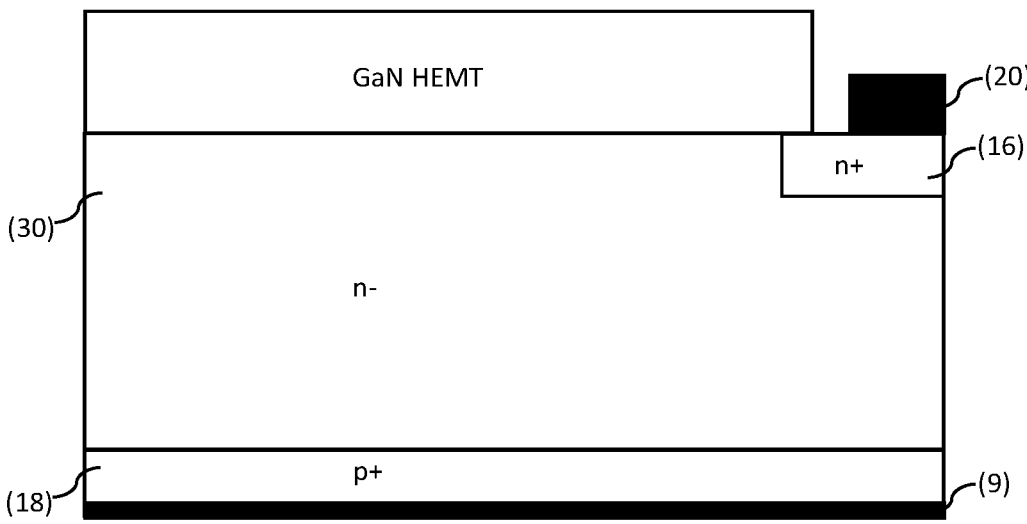
FIG. 15 depicts schematically a junction formed in a substrate according to further embodiments of the present disclosure.

FIG. 15 illustrates an additional embodiment similar to FIG. 11. However, in this embodiment the drift region in the high voltage Si diode is an n-region (30) rather than p-region.

Figure 16:
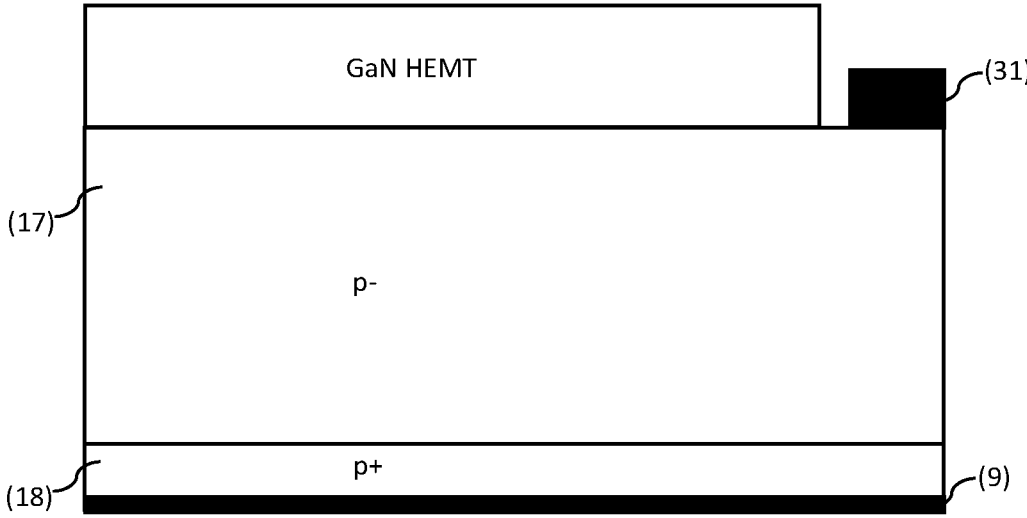
FIG. 16 depicts schematically a substrate with a Schottky contact according to embodiments of the present disclosure.

FIG. 16 illustrates an additional embodiment of the Si diode which comprises a Schottky contact (31). In this embodiment, the diode is a Schottky diode rather than a p-n junction diode. The Schottky terminal may be based on an energy (voltage) barrier formed between a metal (with a specific work function) and a semiconductor substrate.

Figure 17:
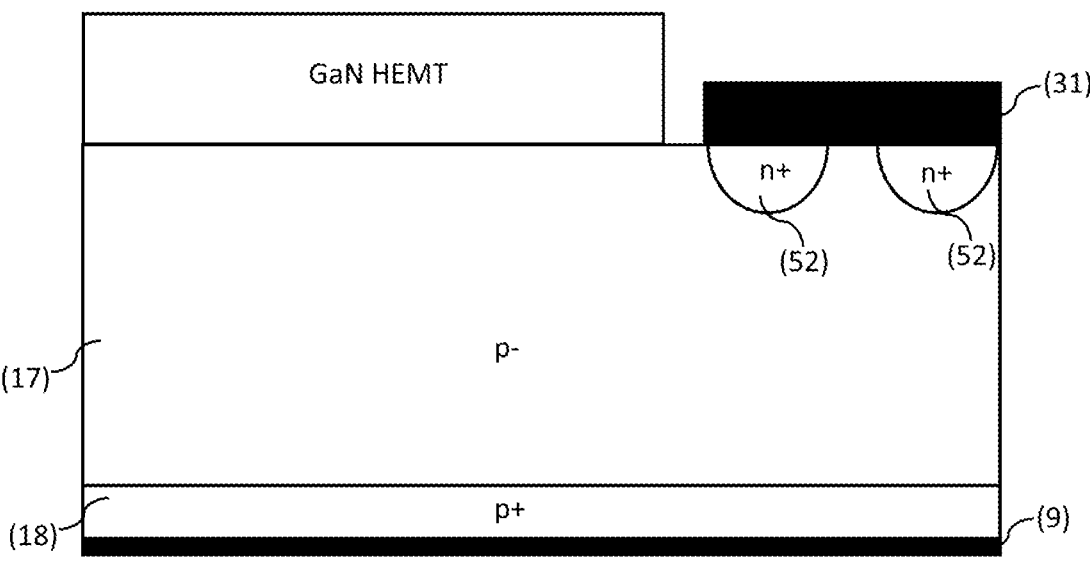
FIG. 17 depicts schematically a substrate with a Schottky contact according to further embodiments of the present disclosure.

FIG. 17 illustrates an additional embodiment. This embodiment comprises a Merged p-n Schottky (MPS) configuration with a Schottky contact (31), an p-drift region (17), a p+ anode region (18) and n+ regions (52) at the MPS anode.

Figure 18:
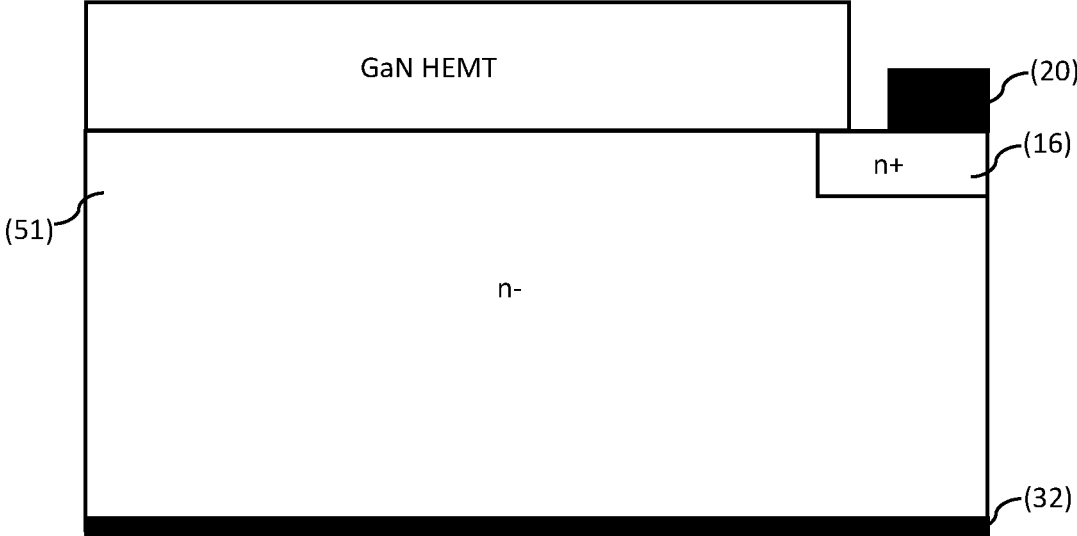
FIG. 18 depicts schematically a substrate with a Schottky contact according to further embodiments of the present disclosure.

FIG. 18 illustrates another embodiment of the Si diode as a Schottky diode with a Schottky contact (32), a n-drift region (51) and a n+ cathode region (16).

Figure 19:
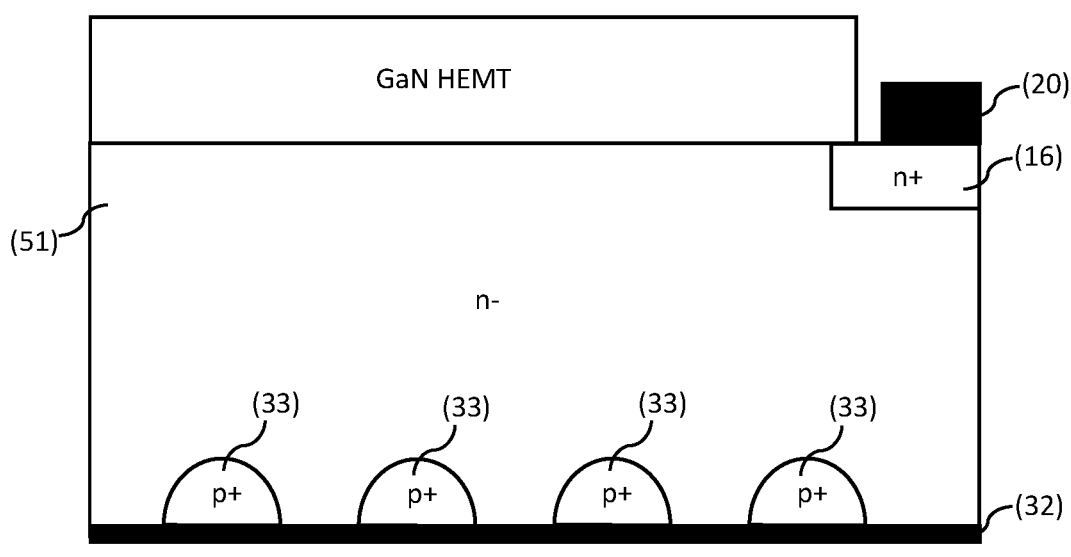
FIG. 19 depicts schematically a substrate with a schottky contact according to further embodiments of the present disclosure.

FIG. 19 illustrates an additional embodiment which comprises a Si Schottky diode. This embodiment comprises a Merged p-n Schottky (MPS) configuration with a Schottky contact (32), an n-drift region (51), a n+ cathode region (16) and p+ regions (33) at the MPS anode.

Figure 20:
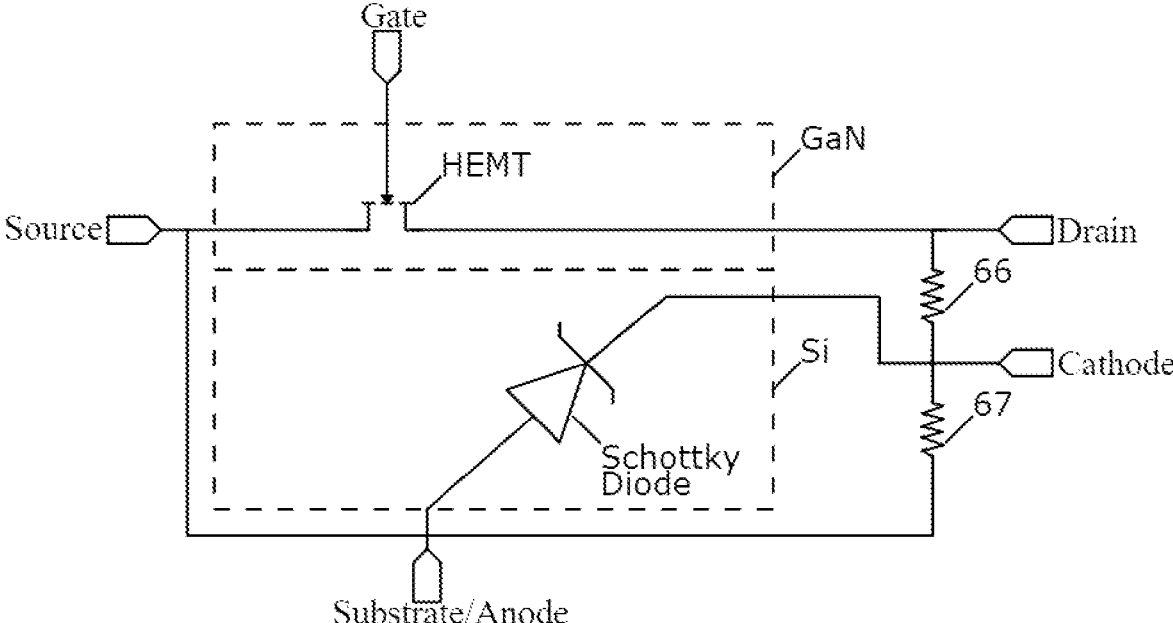
FIG. 20 depicts a circuit schematic of a GaN HEMT comprising the substrate of FIG. 19.

FIG. 20 illustrates a circuit schematic similar to FIG. 12. In FIG. 20, the high voltage Si diode is a Schottky diode corresponding to the example device depicted in FIG. 19.

Figure 21:
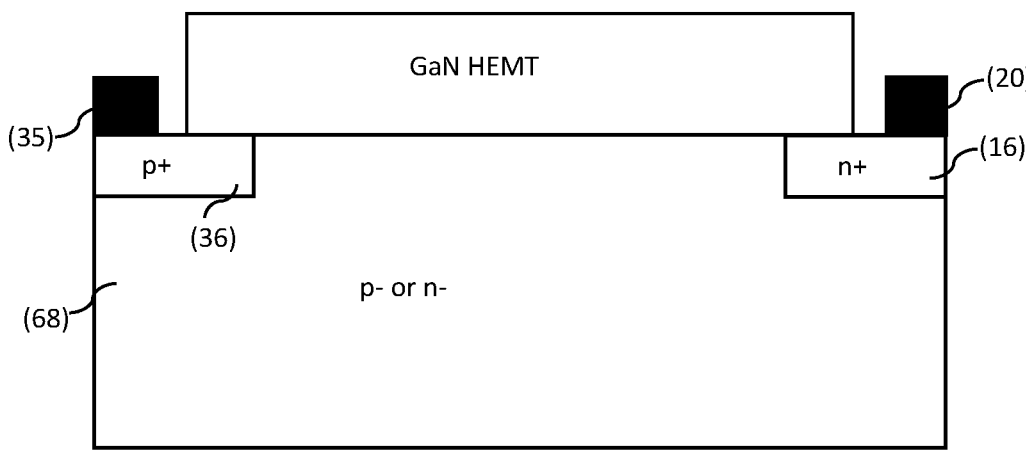
FIG. 21 depicts schematically a substrate comprising a lateral diode according to embodiments of the present disclosure.

FIG. 21 illustrates an additional embodiment which comprises a lateral high voltage Si diode. The lateral Si diode comprises an n+ cathode region (16) and contact (20) which acts as the cathode and may be connected to drain potential (via a potential divider) as shown in previous examples. In this embodiment, the anode of the Si diode which comprises a contact (35) is separated laterally from the cathode contact. The Si diode, in this example, is a p+/p–/n+ or a p+/n–/n+ diode which comprises a p+ anode region (36) and a p- or n-drift region (68) as well as the n+ cathode region (16) presented in previous examples. The high voltage Si diode drift region is again in physical contact with the III-nitride layers above where the GaN HEMT is formed. The anode contact may be connected to the source terminal of the GaN HEMT.

Figure 22:
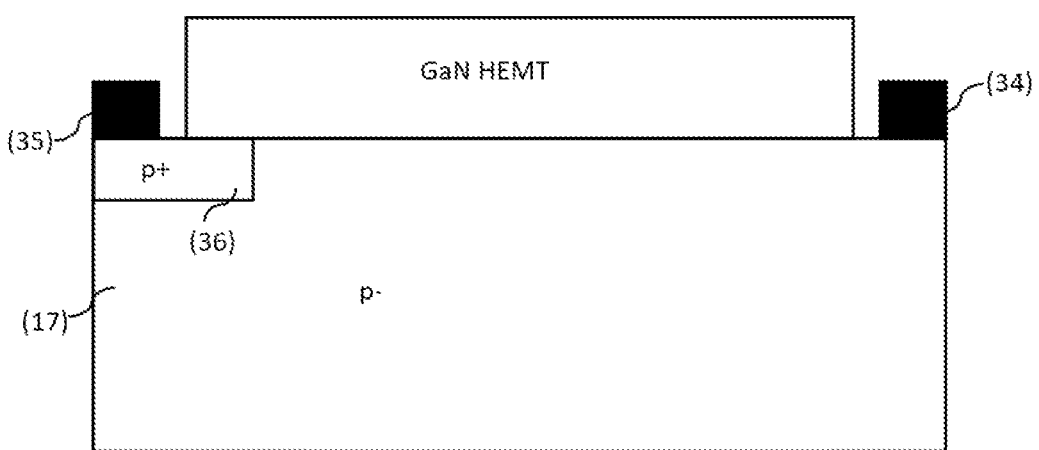
FIG. 22 depicts schematically a substrate comprising a lateral diode according to further embodiments of the present disclosure.

FIG. 22 illustrates an additional example of a lateral Si diode. This example is a Schottky diode where the cathode contact 34 is a Schottky contact and comprises a p-drift region (17) and a p+ anode region (36).

Figure 23:
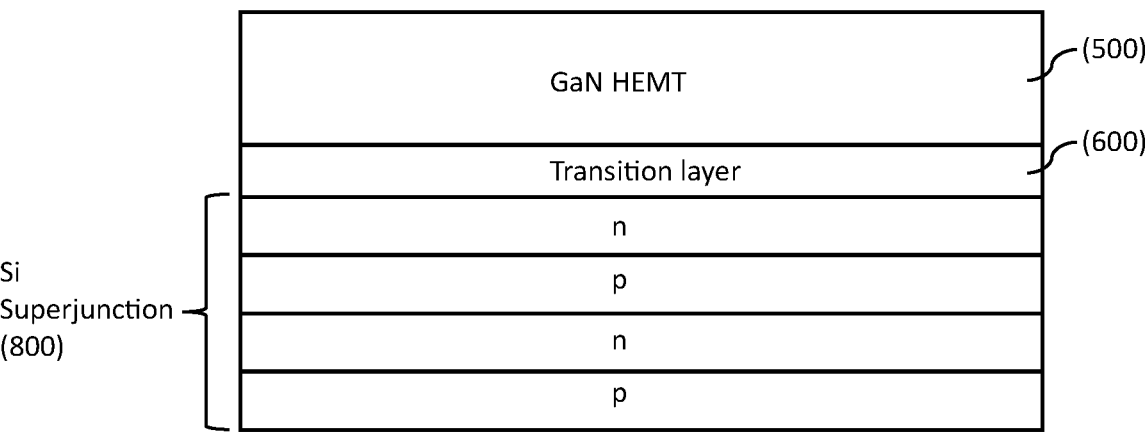
FIG. 23 depicts schematically a substrate comprising a Si superjunction according to embodiments of the present disclosure.

FIG. 23 illustrates an additional embodiment according to the present disclosure. This embodiment illustrates a Si superjunction (800) in the Si substrate which comprises alternating n/p layers. The superjunction may be used in the high voltage Si diode drift region to enable a more effective potential distribution during reverse bias conditions. When the superjunction is used as a drift region in a high voltage diode, the n and p layers deplete at high reverse voltages applied between the anode and cathode terminals. The superjunction structure is configured for charge compensation between the n and p layers to provide more uniform electric field and potential distribution during reverse bias.

Figure 24:
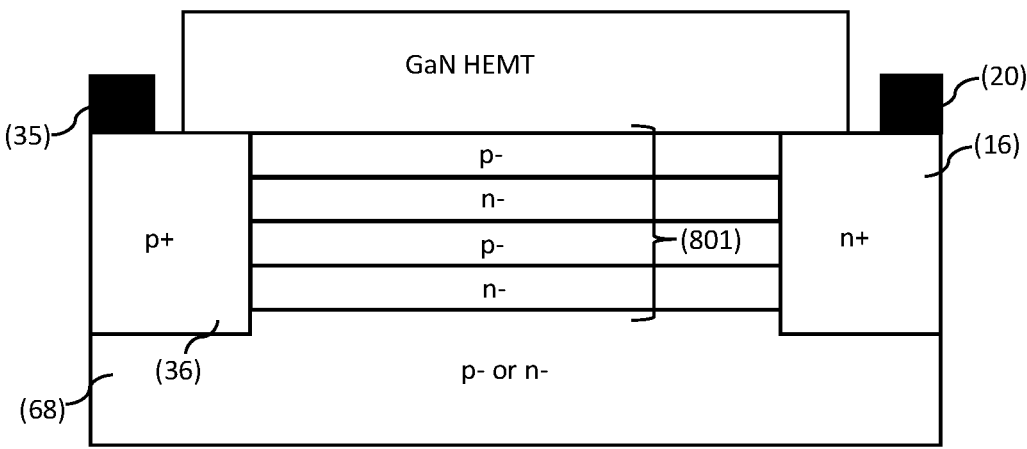
FIG. 24 depicts schematically a substrate comprising a lateral diode and a Si superjunction according to embodiments of the present disclosure.

FIG. 24 illustrates an embodiment which comprises a Si superjunction drift region (801) in a lateral Si diode with an anode contact (35) and a cathode contact (20). Part (or the entirety) of the superjunction drift region is physically arranged directly under the active III-Nitride semiconductor region where the GaN HEMT is formed.

Figure 25:
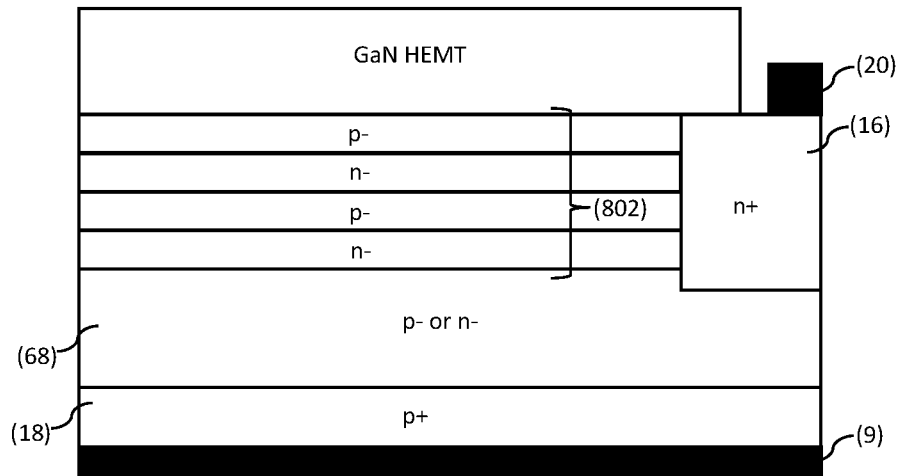
FIG. 25 depicts schematically a substrate comprising a vertical diode and a Si superjunction according to embodiments of the present disclosure.

FIG. 25 illustrates an embodiment which comprises a Si superjunction drift region (802) in a vertical Si diode, where the anode is the back metallisation contact (9) and the cathode contact (20) is placed on the front end of the wafer.

Figure 26:
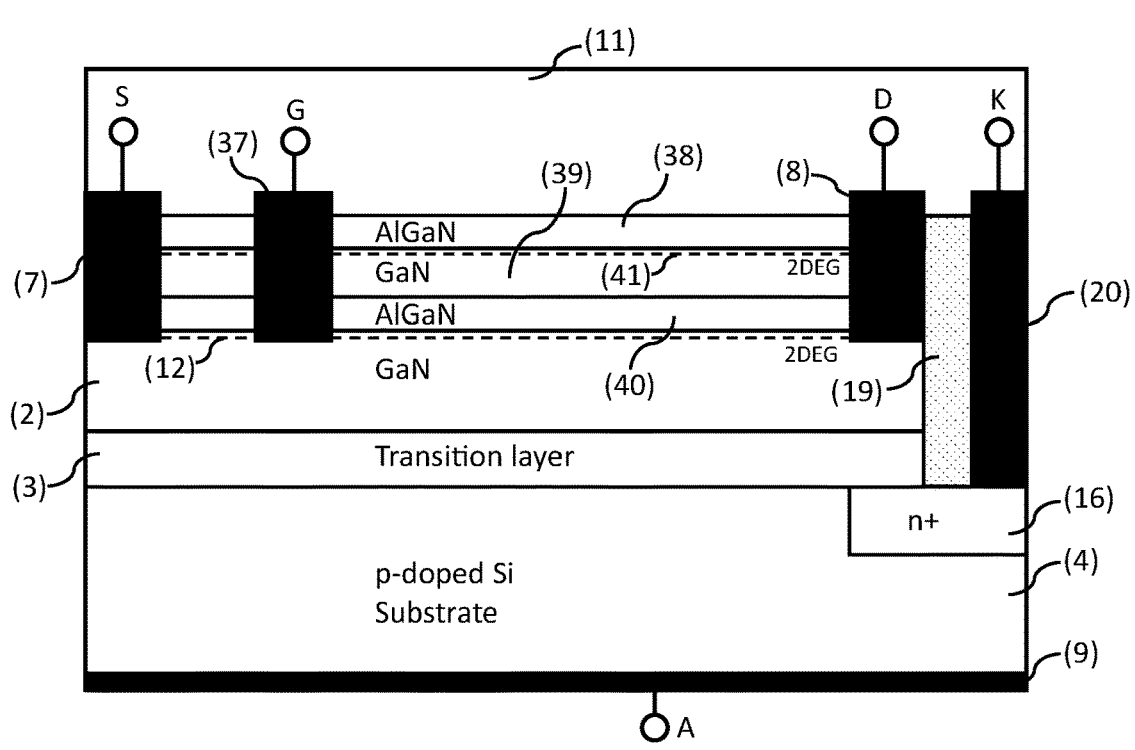
FIG. 26 depicts schematically a GaN HEMT according to further embodiments of the present disclosure.

FIG. 26 illustrates an additional embodiment which comprises a multichannel HEMT and a high voltage Si diode. The example illustrated may be described as having two channels. More than two channels may be used in other examples. One 2DEG (12) is present at the interface of AlGaN (40)/GaN (2) and a second 2DEG (41) is present at the interface of AlGaN (38)/GaN (39). Gate (37) may be an insulated gate or other common gate technology for multichannel HEMTs.

Figure 27:
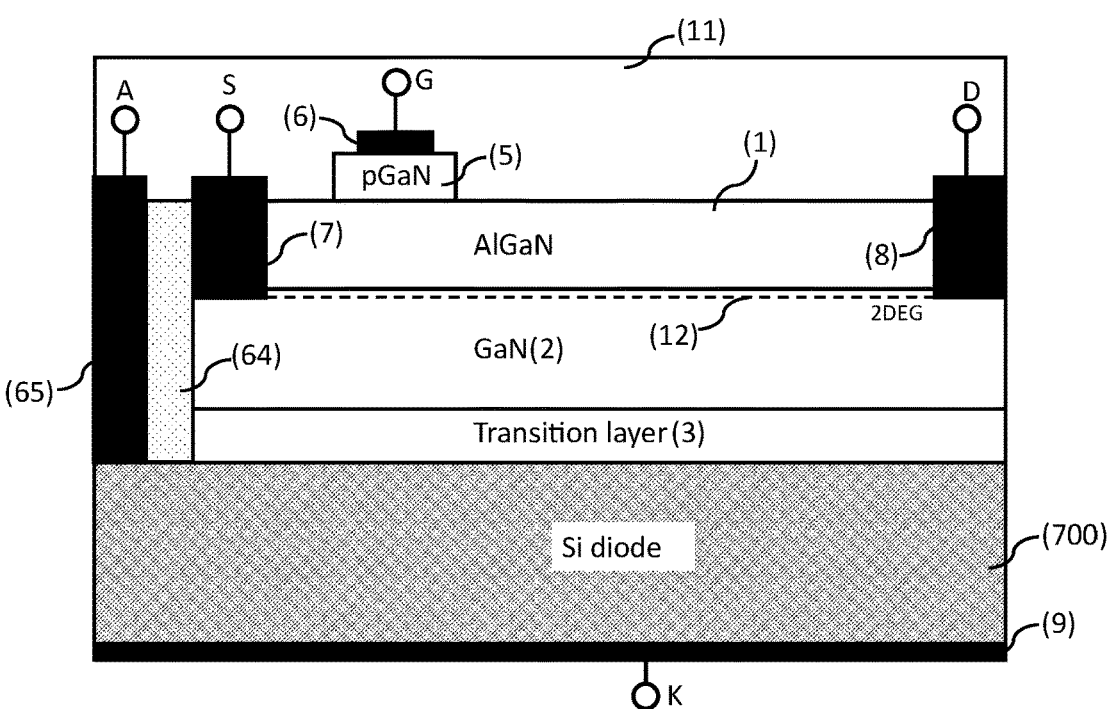
FIG. 27 depicts schematically a GaN HEMT according to further embodiments of the present disclosure.

FIG. 27 illustrates an additional embodiment according to the present disclosure. This embodiment comprises a GaN HEMT and a high voltage Si diode as in some previous embodiments. However, in this embodiment, the cathode (K) of the Si diode is the backside metallisation contact of the Si substrate. The anode of the Si diode is placed on the frontend of the Si substrate as contact (65). In this example, the anode of the Si diode is separated from the GaN HEMT and more specifically the source contact (7), by an isolation region (64). Isolation region (64) may be a dielectric material.

Figure 28:
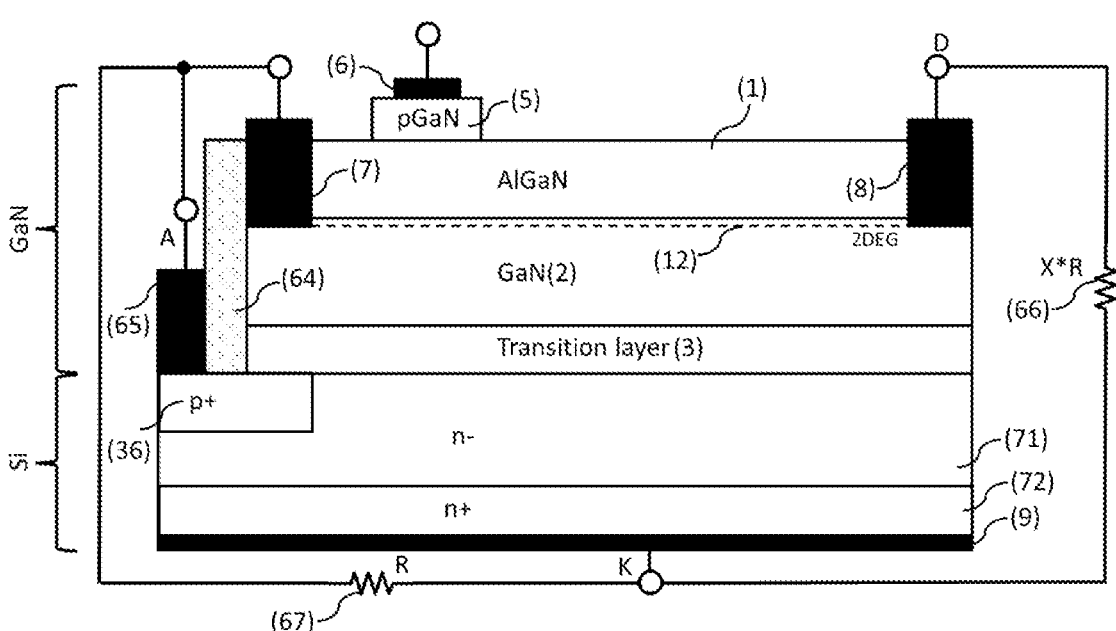
FIG. 28 depicts schematically a GaN HEMT according to further embodiments of the present disclosure.

FIG. 28 illustrates a schematic example of an additional embodiment. The Si diode in this embodiment is a p+/n–/n+ diode with a n-drift region (71), a p+ cathode region (36) and a n+ cathode region (72).

Figure 29:
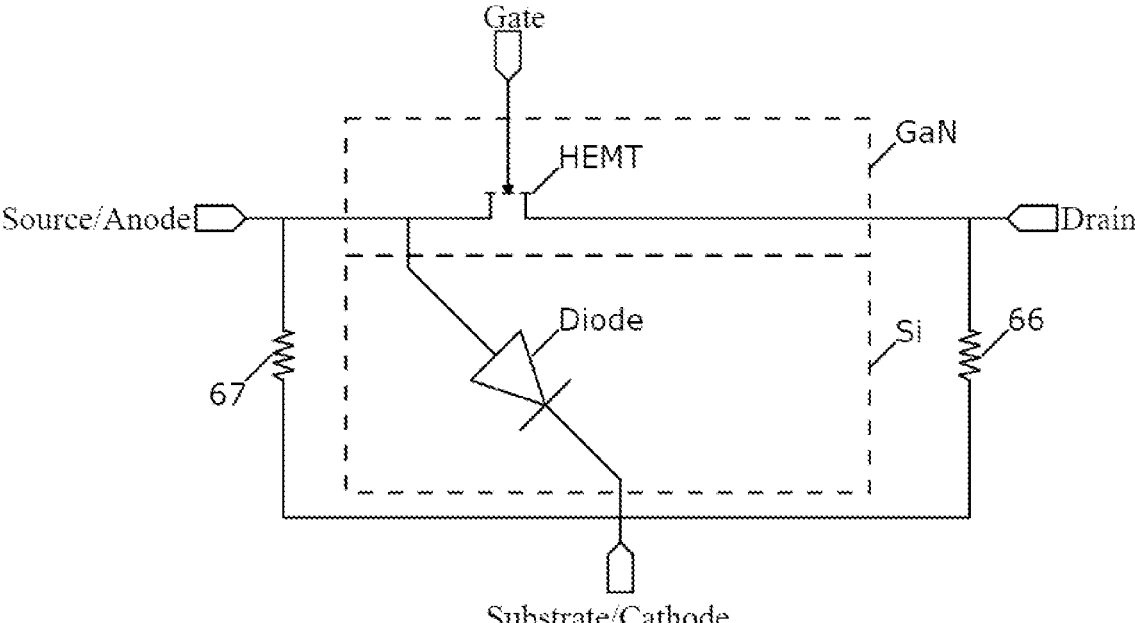
FIG. 29 depicts a circuit schematic of the device depicted in FIG. 28.

FIG. 29 illustrates a circuit schematic of some of the examples illustrated for example in FIG. 28. The schematic comprises a GaN HEMT, a potential divider and a high voltage Si diode.

Figure 30:
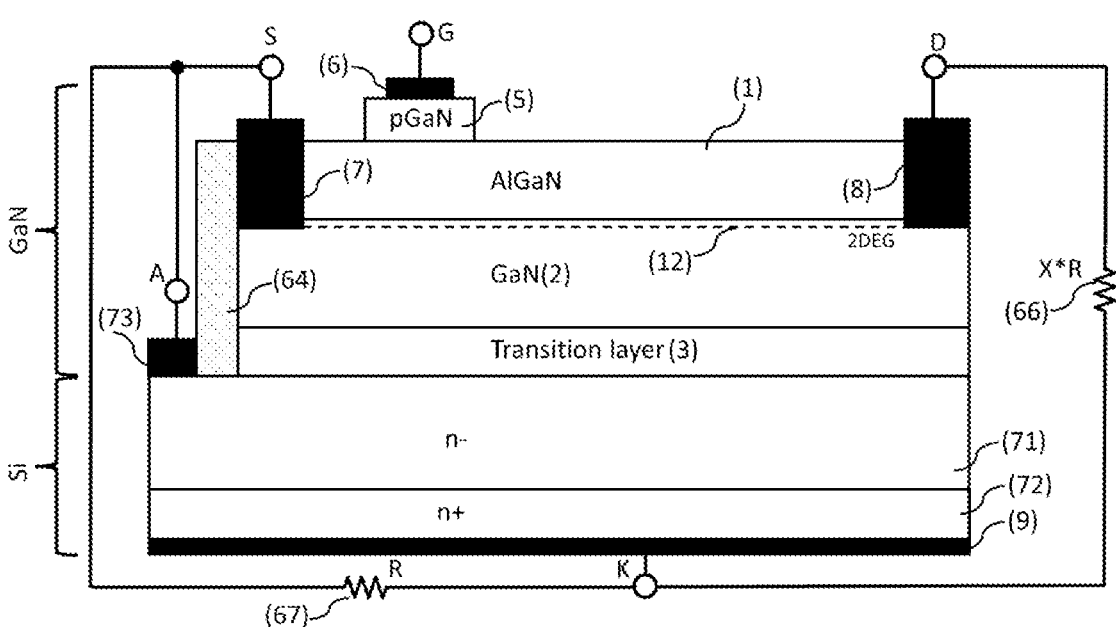
FIG. 30 depicts schematically a GaN HEMT according to further embodiments of the present disclosure.

FIG. 30 illustrates a schematic example of an additional embodiment. The Si diode in this embodiment is a Schottky diode with a Schottky anode contact (73), an n-drift region (71) and a n+ cathode region (72).

Figure 31:
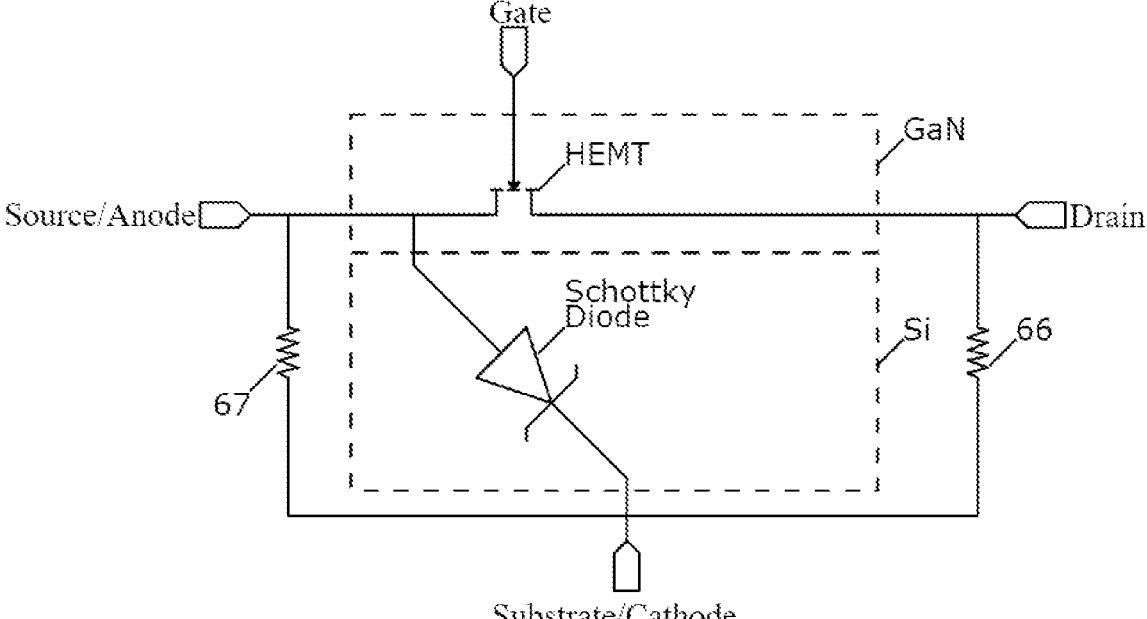
FIG. 31 depicts a circuit schematic of the device depicted in FIG. 30.

FIG. 31 illustrates a circuit schematic similar to FIG. 29. In FIG. 31, the Si diode is a Schottky diode as illustrated for example in FIG. 30.

The skilled person will understand that in the preceding description and appended claims, positional terms such as 'top', 'front', 'side', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

It will be understood that in implementations of the present invention, a power device may be a device that contains a high voltage transistor in a first wide bandgap semiconductor and a high voltage diode associated with the second wide bandgap semiconductor.

It will be understood that in implementations of the present invention, a wide bandgap semiconductor may be any semiconductor with bandgap in excess of 2 eV.

It will be understood that in implementations of the present invention, a high voltage diode may be a diode associated with the substrate that features two terminals, anode and cathode and an n-type or p-type drift region, wherein the drift region is formed in the second wide bandgap semiconductor. The diode supports largely the voltage across the anode-cathode terminals when the diode is in reverse-bias (cathode terminal positively biased with respect to the anode terminal).

It will be understood that in implementations of the present invention, the substrate may be a region that comprises a second wide bandgap semiconductor and wherein the drift region of the diode is formed. The substrate may offer a mechanical support to the transistor. The substrate can be connected or connectable to a backside electrical terminal and may be attached to a heat sink.

It will be understood that in implementations of the present invention, the active area may be an area within the high voltage transistor that is active in all steady-state and transient modes and wherein in particular on-state conduction takes place.

It will be understood that in implementations of the present invention, the isolation region may be a region(s) within the power device outside the active areas, where the on-state conduction does not take place.

It will be understood that in implementations of the present invention, the heterojunction transistor may be a high voltage transistor in a first wide bandgap semiconductor, wherein the wide bandgap semiconductor may contain several layers/regions of IIII-nitride and at least one heterojunction interface between GaN and AlGaN where a 2DEG is formed. In examples, the heterojunction transistor may be a GaN HEMT, but other suitable transistors may also be used.

It will be understood that in implementations of the present invention, the semiconductor active region may be a region within the active area of the device which comprises a GaN/AlGaN heterojunction, and where the terminals of the heterojunction transistor, source, drain are operatively connected and the gate terminal of the heterojunction transition is positioned over.

It will be understood that in implementations of the present invention, a HEMT or GaN HEMT may be a heterojunction transistor that is a high electron mobility transistor made in Gallium nitride (or III-Nitride semiconductor) that contains a 2DEG between a source and a drain terminal, controlled by a gate terminal.

It will be understood that in implementations of the present invention, a p+ anode layer may be a layer within the high voltage diode is that is heavily doped with acceptor type ions (p-type ions) and that is connected to the anode terminal.

It will be understood that in implementations of the present invention, a n+ cathode layer may be a layer within the high voltage diode is that is heavily doped with donor type ions (n-type ions) and that is connected to the cathode terminal.

It will be understood that in implementations of the present invention, a p-GaN may be a region that is formed within a GaN semiconductor with p-type doping.

It will be understood that in implementations of the present invention, an anti-parallel diode may be a high voltage diode that has the anode terminal connected to the source terminal of the high voltage transistor and the cathode terminal connected to the anode terminal of the high voltage transistor.

It will be understood that in implementations of the present invention, a superjunction may be a structure formed of vertically or laterally alternating n and p doped layers. When the superjunction is used as a drift region in a high voltage diode, the n and p layers deplete at high reverse voltages applied between the anode and cathode terminals. The superjunction structure is configured for charge compensation between the n and p layers to provide more uniform electric field and potential distribution during reverse bias.

Many other effective alternatives will occur to the person skilled in the art. It will be understood that the disclosure is not limited to the described embodiments, but encompasses all the modifications which fall within the spirit and scope of the disclosure.

The invention claimed is:

1. A power semiconductor device comprising:
a heterojunction transistor, the heterojunction transistor comprising:
an active III-nitride semiconductor region comprising at least one heterojunction formed between a GaN layer and a AlGaN layer;
a drain terminal operatively connected to the active III-nitride semiconductor region;
a source terminal laterally spaced from the drain terminal and operatively connected to the active III-nitride semiconductor region; and
a gate terminal positioned over the active III-nitride semiconductor region, the gate terminal being formed between the drain terminal and the source terminal; and
a substrate, wherein the substrate comprises a monocrystalline silicon material;
a high voltage diode associated with the substrate, the high voltage diode comprising a cathode terminal, an anode terminal and a drift region, wherein at least a part of the drift region is formed within the substrate;
wherein the heterojunction transistor is positioned over the substrate such that the high voltage diode is located below at least part of the heterojunction transistor, wherein the drift region is adjacent to and in physical contact with the active III-nitride semiconductor region; and
wherein at least one of:
the cathode terminal and the drain terminal are operatively connected;
the anode terminal and the source terminal are operatively connected;
the cathode terminal is operatively connected to a fixed high voltage rail; or
the anode terminal is operatively connected to a low voltage DC terminal.

2. A power semiconductor device according to claim 1, wherein at least part of the drift region of the high voltage diode is located below at least part of an active area of the semiconductor region.

3. A power semiconductor device according to claim 2, wherein the heterojunction power semiconductor device is configured such that when a higher voltage is applied to the drain terminal with respect to the source terminal of the heterojunction transistor, the high voltage diode is in a reverse bias mode thereby blocking a substantial fraction of the voltage applied within its drift region.

4. A power semiconductor device according to claim 1, wherein the cathode terminal and the drain terminal are operatively connected via a potential divider such that a potential on the cathode terminal is smaller than the potential on the drain terminal.

5. A power semiconductor device according to claim 4, wherein the potential divider comprises large resistors or resistors and capacitors, and wherein the large resistors or resistors and capacitors are provided either:

(i) externally to the heterojunction power device;

(ii) within a same package as the heterojunction power device; or (iii) monolithically integrated with the heterojunction transistor.

6. A power semiconductor device according to claim 1, wherein the substrate comprises a first side facing the heterojunction transistor, and a second side opposite to the first side, wherein at least one of:

one of the anode terminal and the cathode terminal is operatively connected to the second side of the substrate; or one of the anode terminal and the cathode terminal is operatively connected to the first side of the substrate.

7. A power semiconductor device according to claim 1, wherein the cathode terminal or the anode terminal forms at least in part a Schottky contact to the substrate, such that a Schottky diode is provided between the anode and cathode terminals.

8. A power semiconductor device according to claim 7, wherein the high voltage diode is the Schottky diode, and wherein the Schottky contact is positioned between adjacent highly doped p-type or n-type regions.

9. A power semiconductor device according to claim 1, wherein the high voltage diode is configured to provide avalanche capability to the heterojunction power device.

10. A power semiconductor device according to claim 9 wherein the breakdown of the heterojunction transistor is limited by the avalanche of the high voltage diode.

11. A power semiconductor device according to claim 1, where the heterojunction comprises at least one active two dimensional carrier gas channel.

12. A power semiconductor device according to claim 1, further comprising a second heterojunction transistor positioned over the substrate, the second heterojunction transistor comprising:

a second active III-nitride semiconductor region comprising a second heterojunction formed between a second GaN layer and a second AlGaN layer;

a second drain terminal operatively connected to the second active III-nitride semiconductor region;

a second source terminal laterally spaced from the second drain terminal and operatively connected to the second active III-nitride semiconductor region; and a second gate terminal positioned over the second active III-nitride semiconductor region, the second gate terminal being formed between the second drain terminal and the second source terminal.

13. A power semiconductor device according to claim 12, wherein the heterojunction transistor and the second heterojunction transistor are connected in a half bridge configuration, and wherein either:

the high voltage diode is common to the heterojunction transistor and the second heterojunction transistor; or wherein the substrate comprises a second high voltage diode positioned below the second heterojunction transistor, wherein the second high voltage diode comprises a second anode terminal and a second cathode terminal.

14. A power semiconductor device according to claim 1, comprising one or more integrated low-voltage devices or circuits, the low-voltage circuits positioned either:

(i) adjacent to the heterojunction transistor;

(ii) in the substrate adjacent to the heterojunction transistor; or (iii) adjacent to the high voltage diode.

15. A power semiconductor device according to claim 1, wherein the substrate comprises a superjunction structure formed of vertically or laterally alternating n and p layers the superjunction structure positioned below at least part of the heterojunction transistor.

16. A power semiconductor device comprising:

a heterojunction transistor, the heterojunction transistor comprising:

an active III-nitride semiconductor region comprising at least one heterojunction formed between a GaN layer and a AlGaN layer;

a drain terminal operatively connected to the active III-nitride semiconductor region;

a source terminal laterally spaced from the drain terminal and operatively connected to the active III-nitride semiconductor region; and a gate terminal positioned over the active III-nitride semiconductor region, the gate terminal being formed between the drain terminal and the source terminal; and a substrate, wherein the substrate comprises a monocrystalline silicon material;

a high voltage diode associated with the substrate, the high voltage diode comprising a cathode terminal, an anode terminal and a drift region, wherein at least a part of the drift region is formed within the substrate;

wherein:

the heterojunction transistor is positioned over the substrate such that the high voltage diode is located below at least part of the heterojunction transistor, wherein the drift region is adjacent to and in physical contact with the active III-nitride semiconductor region;

at least part of the drift region of the high voltage diode is located below at least part of an active area of the semiconductor region;

the drift region of the high voltage diode comprises a p-type or n-type doped region, and when a high voltage is applied across the drain and source terminals, the high voltage diode is reverse biased and configured to support a depletion layer within the doped region; and wherein at least part of the depletion layer is formed below the active semiconductor region and is configured to contribute to supporting a voltage between the drain terminal of the heterojunction transistor and the anode terminal of the high voltage diode.

17. A power semiconductor device according to claim 16, wherein the dimensions and doping levels of the doped region are configured to support a large voltage between the anode and cathode terminals.

18. A power semiconductor device according to claim 16, wherein a second n-type or p-type doped region is formed below or above the drift region of the high voltage diode, wherein the second doped region has a higher doping concentration than the doped region, optionally wherein the second doping region is operatively connected to the anode terminal or the cathode terminal.

19. A power semiconductor device comprising:

a heterojunction transistor, the heterojunction transistor comprising:

an active III-nitride semiconductor region comprising at least one heterojunction formed between a GaN layer and a AlGaN layer;

a drain terminal operatively connected to the active III-nitride semiconductor region;

a source terminal laterally spaced from the drain terminal and operatively connected to the active III-nitride semiconductor region; and a gate terminal positioned over the active III-nitride semiconductor region, the gate terminal being formed between the drain terminal and the source terminal; and a substrate, wherein the substrate comprises a monocrystalline silicon material;

a high voltage diode associated with the substrate, the high voltage diode comprising a cathode terminal, an anode terminal and a drift region, wherein at least a part of the drift region is formed within the substrate;

wherein the heterojunction transistor is positioned over the substrate such that the high voltage diode is located below at least part of the heterojunction transistor, wherein the drift region is adjacent to and in physical contact with the active III-nitride semiconductor region; and wherein the substrate comprises one or more of the following layers:

a highly doped p-type layer operatively connected to the anode terminal;

at least one drift layer, wherein the drift layer comprises an n-type doped or p-type doped region; and a highly doped n-type layer operatively connected to the cathode terminal.

\* \* \* \* \*